(12) United States Patent
Moroz et al.

(10) Patent No.: US 8,701,054 B2
(45) Date of Patent: Apr. 15, 2014

(54) BOOSTING TRANSISTOR PERFORMANCE WITH NON-RECTANGULAR CHANNELS

(75) Inventors: Victor Moroz, Saratoga, CA (US); Munkang Choi, Pleasanton, CA (US); Xi-Wei Lin, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/237,818

(22) Filed: Sep. 20, 2011

(65) Prior Publication Data

US 2012/0011479 A1 Jan. 12, 2012

Related U.S. Application Data

(62) Division of application No. 12/390,338, filed on Feb. 20, 2009, now abandoned.

(60) Provisional application No. 61/206,083, filed on Jan. 27, 2009.

(51) Int. Cl.
*G06F 17/50* (2006.01)

(52) U.S. Cl.
USPC .............. 716/54; 716/50; 716/55; 716/118; 716/119

(58) Field of Classification Search
USPC .......................................................... 716/54
See application file for complete search history.

(56) References Cited

U.S. PATENT DOCUMENTS

| 5,246,800 | A | 9/1993 | Muray |
| 5,472,814 | A | 12/1995 | Lin |
| 5,702,847 | A | 12/1997 | Tarumoto et al. |
| 6,057,063 | A | 5/2000 | Liebmann et al. |
| 6,096,458 | A | 8/2000 | Hibbs |
| 6,365,947 | B1 | 4/2002 | Vollrath et al. |
| 7,137,089 | B1 | 11/2006 | Kong |
| 7,493,582 | B2 * | 2/2009 | Komaki ................ 716/119 |
| 7,546,557 | B2 * | 6/2009 | Kong ..................... 716/133 |
| 8,001,494 | B2 * | 8/2011 | Hou et al. ................ 716/54 |

(Continued)

FOREIGN PATENT DOCUMENTS

| DE | 4037492 A1 | 5/1992 |
| JP | 08172136 | 7/1996 |

OTHER PUBLICATIONS

Agilent Technologies, "Agilent 85190A IC-CAP 2006, *Nonlinear Device Models*, vol. 1," 2007 ed., 764 pages.

(Continued)

*Primary Examiner* — Vuthe Siek
*Assistant Examiner* — Eric Lee
(74) *Attorney, Agent, or Firm* — Haynes Beffel & Wolfeld LLP; Warren S. Wolfeld

(57) ABSTRACT

Roughly described, the invention includes layouts and masks for an integrated circuit, in which the diffusion shape for a transistor includes a transversely extending jog on one or both transversely opposite sides, the jog having inner and outer corners, at least one of which is located relative to the gate conductor longitudinally such that during lithographic printing of the diffusion shape onto the integrated circuit, the corner will round and extend at least partly into the channel region. The invention also includes aspects for a system and method for introducing such jogs, and for an integrated circuit device having a non-rectangular channel region, the channel region being wider where it meets the source region than at some other longitudinal position under the gate.

40 Claims, 16 Drawing Sheets

(56) References Cited

U.S. PATENT DOCUMENTS

| | | |
|---|---|---|
| 2002/0083408 A1 | 6/2002 | Haffner et al. |
| 2005/0180219 A1 | 8/2005 | Ohba et al. |
| 2007/0096158 A1 | 5/2007 | Komaki |
| 2008/0107974 A1 | 5/2008 | Douzaka et al. |
| 2008/0185666 A1 | 8/2008 | Yoo et al. |
| 2008/0197394 A1 | 8/2008 | Caspary et al. |
| 2009/0178012 A1* | 7/2009 | Chidambarrao et al. ......... 716/2 |

OTHER PUBLICATIONS

Hand A., "Inverse Lithography Makes New Inroads in RET," Semiconductor International, May 12, 2007, 2pp, http://www.semiconductor.net/index.asp?layout=articlePrint@articleID=CA6434690.

Milanfar P., et al., "Double exposure inverse lithography," Solid State Technology, Nov. 2007, 9pp, http://www.solid-state.com/display_article/311162/28/ARTCL/none/none/1/.

Balasinski A. et al., "Optimization of Single Wordline SRAM Cell by OPC Simulation," Olin Microlithography Symposium, Nov. 15-17, 1998, pp. 125-135 plus cover sheet.

Sponton, L. et al., "A Full 3D TCAD Simulation Study of Line-Width Roughness Effects in 65 nm Technology," Proceedings of SISPAD, Monterey, California, pp. 377-380, Sep. 2006.

Moroz, V. et al., "Exploring Methods for Adequate Simulation of Sub-100nm Devices," Proceedings of the 32nd European Solid-State Device Research Conference, Sep. 2002, pp. 299-302.

Gupta, P et al., "Self-Compensating Design for Reduction of Timing and Leakage Sensitivity to Systematic Pattern Dependent Variation," Design and Process Integration for Microelectronic Manufacutring IV, ed. Wong and Singh, Proc. of SPIE vol. 6156, 61560B, 2006, 12pp.

Gupta P. et al., "Modeling Edge Placement Error Distribution in Standard Cell Library," Design and Process Integration for Microelectronic Manufacutring IV, ed. Wong and Singh, Proc. of SPIE vol. 6156, 61560S, 2006, 12pp.

Gupta P. et al., "Lithography Simulation-Based Full-Chip Design Analyses," Design and Process Integration for Microelectronic Manufacutring IV, ed. Wong and Singh, Proc. of SPIE vol. 6156, 61560T, 2006, 8pp.

Gupta, P. et al., "Modeling of Non-Uniform Device Geometries for Post-Lithography Circuit Analysis," Design and Process Integration for Microelectronic Manufacutring IV, ed. Wong and Singh, Proc. of SPIE vol. 6156, 61560U, 2006, 10pp.

Bar-Yehuda, R. et al. "Integrated Image Design and Complex Standard Cmos Cell Generator," Sixteenth Conference of Electrical and Electronics Engineers in Israel, 1989, pp. 1-5.

Annex to Form PCT/ISA/206, Communication Relating to the Results of the Partial International Search, mailed Feb. 5, 2010 in PCT/US2009/062635.

Liebmann, L., "Reducing DfM to Practice: The Lithography Manufacturable Assesor," Proc. of SPIE vol. 6156 61560K-1, (2006), 12 pages.

CN-200980158366.9—Office Action dated May 30, 2013, 23 pages (with English translation).

\* cited by examiner

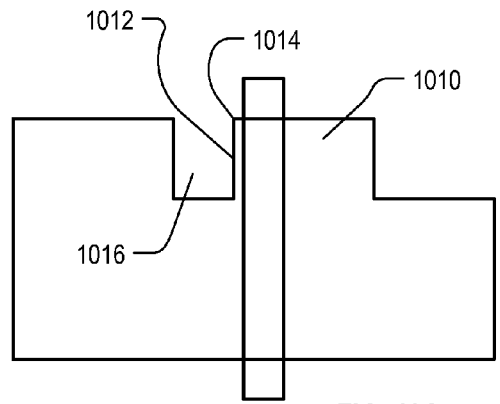
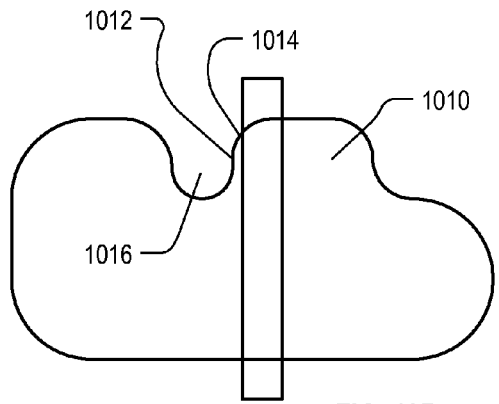
FIG. 10A          FIG. 10B
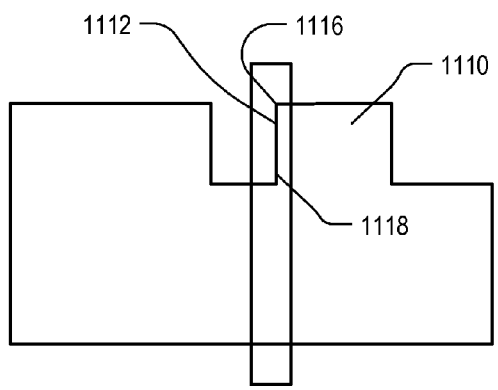
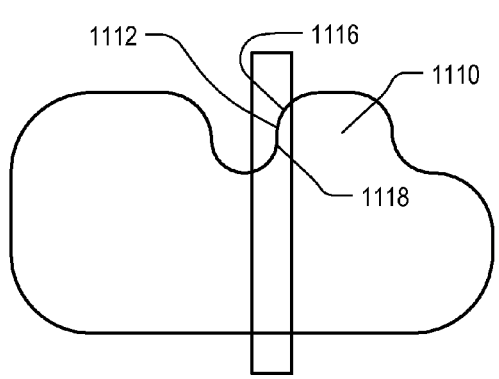
FIG. 11A          FIG. 11B
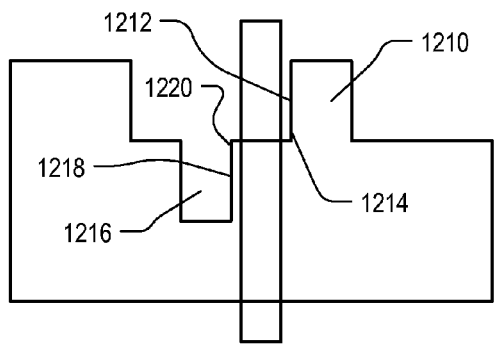
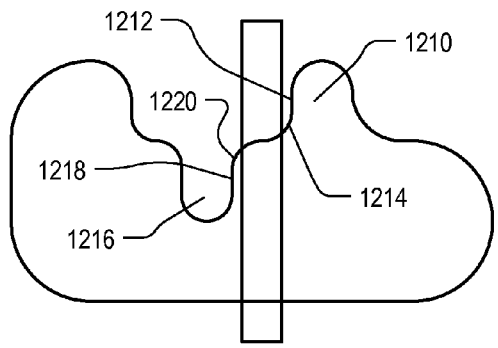
FIG. 12A          FIG. 12B

BOOSTING TRANSISTOR PERFORMANCE WITH NON-RECTANGULAR CHANNELS

RELATED APPLICATIONS

This application is a divisional of co-pending U.S. patent application Ser. No. 12/390,338 filed 20 Feb. 2009 and published on 29 Jul. 2010 under Publication No. US 2010/0187609 A1, which claims priority to U.S. Provisional Application No. 61/206,083, filed 27 Jan. 2009, each of which is incorporated in its entirety herein by reference.

BACKGROUND

As semiconductor fabrication processes continue to shrink, the evolving lithography equipment, the optical proximity correction methods, and the increasingly restrictive design rules are usually doing a good job at maintaining the desired transistor shapes and especially sizes. However, the ongoing layout scaling combined with undesirable effects such as line edge roughness is bringing several increasingly disturbing issues related to variability of transistor performance for technology nodes below 45 nm.

In particular, edges in the active layer are becoming increasingly curvilinear whenever several transistors with different channel widths are placed next to each other, and with gate lengths pushing under 30 nm and channel widths pushing under 100 nm, line edge roughness no longer averages out across the channel,. Instead, it contributes to the active layer curvatures on top of optical proximity and etch bias effects.

FIG. 1A illustrates a typical integrated circuit layout portion in which three transistors having different channel widths share a common diffusion layout shape 110. The three transistors are identifiable by the polysilicon gate shapes 112, 114 and 116 representing transistors T112, T114 and T116, respectively. From left-to-right in the drawing, transistor T112 has the largest width, T114 is narrower, and T116 is narrowest. In order to define the channel widths, one longitudinal side of the diffusion layout shape 110 (the upper side 118 in the drawing) jogs inward (downward in the drawing) at longitudinal position 120 just to the left of gate shape 112, and again at longitudinal position 122 just to the left of gate shape 116. The other longitudinal side of the diffusion layout shape 110 (the lower side 124 in the drawing) jogs inward (upward in the drawing) at longitudinal position 126 just to the left of gate shape 114. Jogs are often made at longitudinal positions close to the narrower transistor channel so as to maximize the current flow through the wider transistor channel. In the diffusion layout shape 110, the jogs 120, 122 and 126 result in inner corners 128, 130 and 132, respectively, located at longitudinal positions which are close to gate shapes.

FIG. 2 illustrates features on an integrated circuit as might be printed using state-of-the-art 193 nm steppers, and a mask set generated using the shapes in FIG. 1A. It can be seen that all the rectangular corners in the layout shapes have been rounded due to diffraction effects. The three circles that have been drawn on the diagram of FIG. 2 illustrate that the rounding radius for the active/diffusion layer is of the order of 60 nm. This radius cannot be reduced significantly by optical proximity correction (OPC) techniques. In addition, it can be seen that due to the tight poly pitch, rounded corners 128, 130 and 132 extend into the transistor channels and distort the intended rectangular channel shape.

The fundamental reasons behind the rounded corners are the need to have transistors with different channel widths that can be achieved by jogs in active/diffusion layer and the inability of 193 nm lithography to squeeze such jogs in between the two poly gates. This problem is expected to get worse as poly-to-poly distance shrinks by 0.7× with each technology node. Typical poly-to-poly distances are expected to be 95 nm for 32 nm node and 65 nm at 22 nm node. Both distances are smaller than two corner rounding radii, which guarantees that channel shapes will be non-rectangular as transistor fabrication processes shrink to these nodes. Prior to now it was not clear how such channel shapes will affect transistor performance parameters, and hence circuit performance and reliability.

SUMMARY

Roughly described, the invention includes layouts and masks for an integrated. circuit, in which the diffusion shape for a transistor includes a transversely extending jog on one or both transversely opposite sides, the jog having inner and outer corners, at least one of which is located relative to the gate conductor longitudinally such that during lithographic printing of the diffusion shape onto the integrated circuit, the corner will round and extend at least partly into the channel region. The invention also includes aspects for a system and method for introducing such jogs, and for an integrated circuit device having a non-rectangular channel region, the channel region being wider where it meets the source region than at some other longitudinal position under the gate.

The above summary is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

FIGS. 10A, 11A and 12A illustrate portions of integrated circuit layout corresponding to FIG. 6A, after modification according to aspects of the invention, as represented in a layout file or in a lithographic mask set.

FIGS. 10B, 11B and 12B illustrate portions of integrated circuit devices fabricated using the layout portions of FIGS. 10A, 11A and 12A, respectively.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Definitions

Figure 1A:
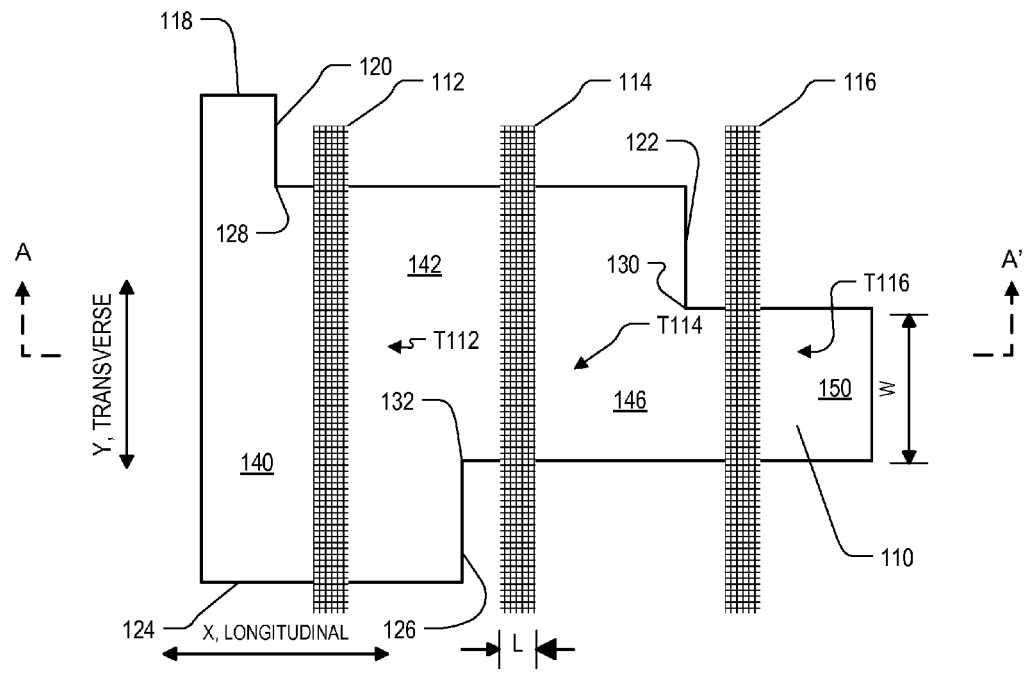
FIG. 1A illustrates a plan view of a layout region of a circuit design.
Figure 1B:
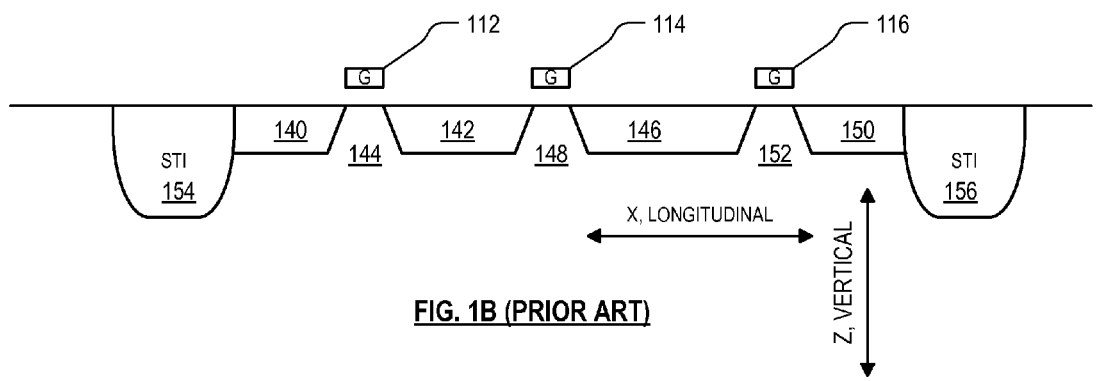
FIG. 1B illustrates a cross-sectional view of a portion of an integrated circuit resulting from the layout region of FIG. 1A, taken at sight-line A-A' as shown in FIG. 1A.

In order to best describe an embodiment of the invention, reference will be made to the illustrative layout portion as shown in FIG. 1A. FIG. 1A illustrates a plan view of the layout region, and FIG. 1B illustrates a cross-sectional schematic of the resulting integrated circuit portion taken at sightline A-A' as shown in FIG. 1A. FIGS. 1A and 1B are sometimes referred to herein collectively as FIG. 1. As previously pointed out, the layout region of FIG. 1 includes three transistors T112, T114 and T116. Referring to transistor T112 as an example, it comprises a first diffusion region 140 to the left of gate conductor 112 as shown in the drawing, and a second diffusion region 142 to the right of the gate conductor 112 as shown in the drawing. One of the diffusion regions 140 and 142 is the source of transistor T112 and the other is the drain, but the source/drain choice is not made until the transistor T112 is connected in a circuit by interconnects (not shown) on the integrated circuit. Below the gate conductor 112 is the channel 144 of transistor T112. Similarly, transistor T114 includes two diffusion regions 142 and 146 separated by channel 148 below the gate conductor 114, and transistor T116 includes diffusion regions 146 and 150 separated by a channel 152 below the gate conductor 116. It can be seen that transistors T112 and T114 share a common diffusion region 142. Similarly, transistors T114 and T116 share a common diffusion region 146.

On longitudinally opposite ends of the diffusion layout shape 120 there are formed respective STI (shallow trench isolation) regions 154 and 1156, containing oxide, in order to isolate the transistor from other nearby circuit elements. The STI regions 154 and 156 are representative of STI surrounding the entire diffusion 110 laterally. In other embodiments the regions outside the diffusion 110 might be another dielectric material, other than oxides.

As used herein, the term "region" represents a two-dimensional area in a plan view of the layout. The term, as used herein, does not necessarily imply a physical boundary. That is, one "region" can contain multiple "sub-regions", which themselves are considered herein to be "regions" as well. Thus it is reasonable to refer to a region within a diffusion region, even one that has not been defined physically in any way. The current path diffusion "regions" 140, 142, 146 and 150 in FIG. 1A, for example, are themselves "sub-regions" of diffusion region 110.

If the transistors T112, T114 and T116 are N-channel transistors, then all of the diffusion regions 140, 142, 146 and 150 have n-type doping, typically n+. The volumes below these diffusion regions (including the gate regions) have p-type doping. On the other hand, if the transistors T112, T114 and T116 are P-channel transistors, then all of the diffusion regions 140, 142, 146 and 150 have p-type doping, typically p+. The volumes below these diffusion regions (including the gate regions) have n-type doping. As used herein, 'p' and 'n' are doping "types". As used herein, p+ doping and n+ doping are still referred to as having 'p' and 'n' doping "types", respectively, albeit with greater doping densities. The two doping types 'p' and 'n' are considered herein to be "opposite" doping types.

In modern integrated circuit fabrication processes, the various components of a transistor are formed using a self-aligned technique. In this technique, the volume underlying the transistor (including the channel region) is doped first. This may be accomplished by doping the entire wafer (such as by providing a p-type starting substrate), or by implanting a well of the desired doping type (such as by implanting an n-well in portions of a p-type wafer that will contain p-channel transistors). In a second step, the active regions are defined using a diffusion mask having shapes such as 110. Areas outside these shapes are etched and filled with STI oxide, and then the areas inside the shapes are doped as required for the transistor channels they will contain. Next, the gate conductors (as well as other parts of the gate stack) are formed on the surface of the wafer. One or more lithographic masks are used to expose the wafer with shapes to define the gate conductors. Next, the diffusion regions are exposed to ion implantation to dope the source and drain sub-regions of the diffusion shapes. Since ions do not implant through the previously formed gate stacks, the areas below the gate stack do not receive the implanted ions. These areas thereby become channel regions self-aligned with the gate conductors as shown in FIG 1B. Because of this sequence of process steps, no mask is ever created that has shapes corresponding to the individual diffusion sub-regions 140, 142, 146 and 150. Instead, the mask for forming these regions has a single shape 110, referred to herein as a "diffusion shape", which includes the geometric union of diffusion regions 140, 142, 146 and 150, and channel regions 144, 148 and 152.

The source and drain of a transistor are considered herein to be its "current path terminals", and gate is considered its "control terminal". As used herein, the source terminal of a transistor is defined as the current path terminal from which charge carriers originate when the transistor is conducting, and the drain is defined as the current path terminal into which charge carriers flow. For a p-channel transistor, the charge carriers are holes (positively charged carriers). Therefore the source of a p-channel transistor is the current path terminal that is at the higher voltage when the transistor is conducting, and the drain is at the lower voltage. For an n-channel transistor, the charge carriers are electrons (negatively charged particles). Therefore the drain of an n-channel transistor is at the higher voltage when the transistor is conducting, and the source is at the lower voltage. Since the source and drain of a transistor are both implemented as diffusions of the same doping type, reference may be necessary to the interconnect layers and the circuit that has been implemented, in order to determine which current path terminal is the source and which is the drain. Contrarily, one may define which current path terminal is the source and which is the drain, by applying the interconnects as appropriate for the desired choice.

Referring again to FIG. 1, as used herein, the "longitudinal" direction of a transistor is the direction of current flow from one current path terminal to the other when the transistor is turned on. The "transverse" direction is perpendicular to the longitudinal direction, and perpendicular to the direction of current flow. Both the longitudinal and transverse directions of the transistor are considered to be "lateral" directions, meaning a direction that is parallel to the surface. Other "lateral" directions include those (not shown) which are parallel to the surface but intersect both the transverse and longitudinal directions at angles. The "vertical" direction is normal to the surface of the channel and therefore perpendicular to all possible lateral directions. The "length" of a structure in the layout is its length in the longitudinal direction, and its "width" is its width in the transverse direction. Both "length" and "width" of a region are considered herein to be measured on the top surface of the region. It can be seen from the layout of transistors T112, T114 and T116 that the length of their channels are significantly shorter than their widths, which is typical for the transistors that are used in logic circuits. Also shown in FIG. 1 are the X, Y, and Z coordinate axes. In the layout of FIG. 1, the X direction is the same as the longitudinal direction, the Y direction is the same as the transverse direction, and the Z direction is perpendicular to both the longitudinal and transverse directions, representing a depth into the integrated circuit chip.

Consequences of Non-Rectangular Active Layer Shapes

Figure 2:
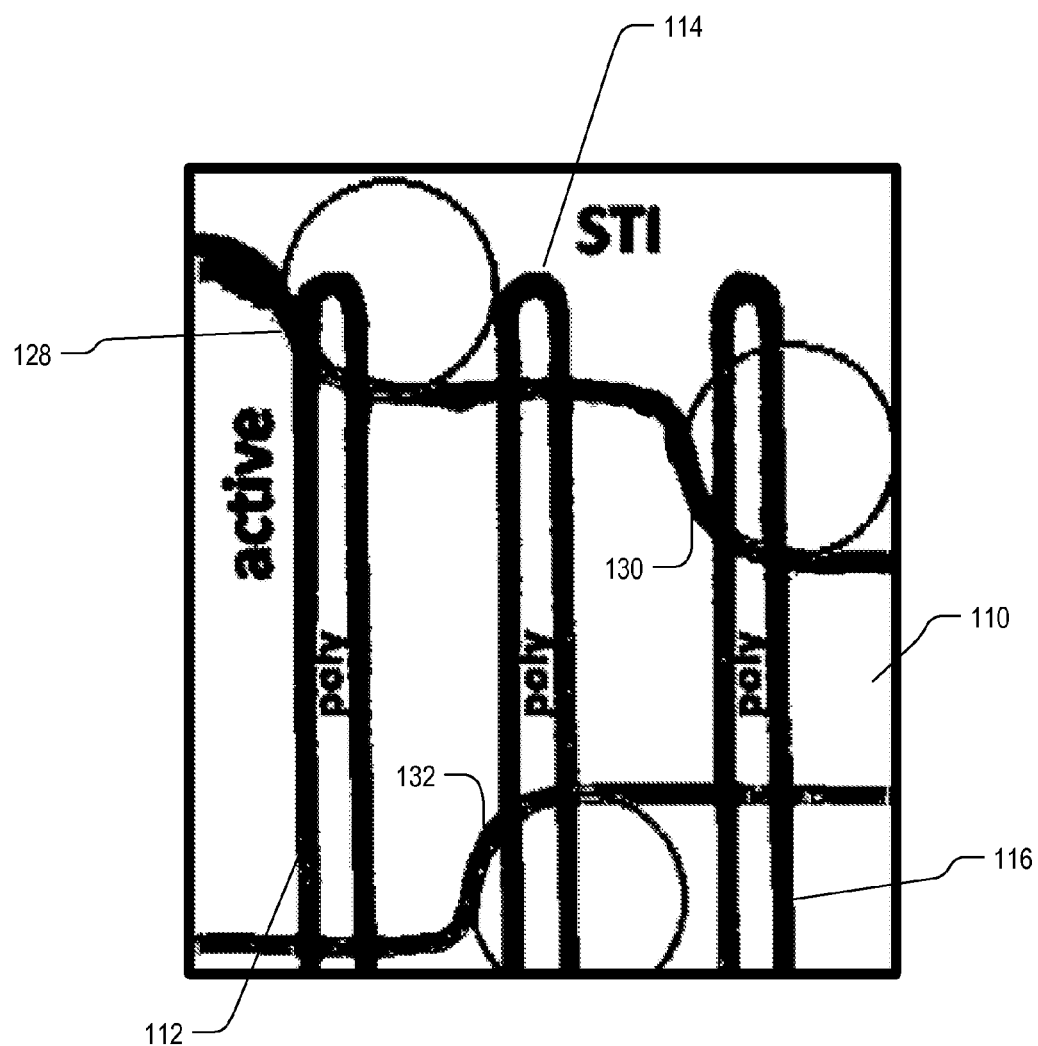
FIG. 2 illustrates a plan view of a portion of an integrated circuit resulting from the layout region of FIG. 1A.

Computer simulations of transistors having channel shapes approximating those with rounded inner corners can be used to study the consequences on transistor performance parameters of non-rectangular channel regions. A diffusion shape is chosen which transitions from a wider diffusion region to a narrower diffusion region, such as each of the transistors in FIG. 2. It is found that Vtsat (the saturation threshold voltage, measured at high drain bias) exhibits a significant difference depending on which diffusion region is connected as the source and which the drain. Specifically, Vtsat is higher if the narrower region is the drain, and lower if the wider region is the drain. This asymmetry is not found for Vtlin (the linear transistor threshold voltage, measured at low drain bias), which appears to be independent of the source/drain choice.

The asymmetry in Vtsat threshold behavior translates into a corresponding asymmetry in current response. Ion current (the drain current at high drain and gate biases) for a transistor with the narrower region assigned as the drain is only slightly higher than for a transistor with the wider region assigned as the drain, but the difference in Ioff currents (the drain current at high drain bias and zero gate bias) is much more striking. Ioff for a transistor with the narrower region assigned as the drain and rounded corners extending into the channel can be as low as ⅓ of the Ioff for a transistor with a rectangular channel shape, depending on factors such as the fraction of the rounded corner that underlies the gate. It can be as low as ⅑ of the Ioff for a transistor with rounded corners extending into the channel from a drain which is assigned to the wider region. A lower Ioff current implies lower leakage current, and therefore better power savings for low power circuits.

Integrated circuits whose layouts fail to take into account corner rounding under the gate, are likely to experience transistor performance fluctuations from enhancement to degradation in a seemingly random pattern. The problem is expected to continue to worsen as nominal transistor widths are scaled down for each subsequent technology node. On the other hand, understanding and monitoring of this effect would eliminate this source of strong and apparently random performance fluctuations. Just as significantly, the effect can be used to advantage by including corner rounding effects in the choice of the source/drain assignments. For example, by systematically choosing the wider diffusion region as the source, transistor leakage currents can be improved dramatically. Still further, rounded corners extending under the gate can be introduced intentionally to take advantage of these effects.

Integrated Circuit Design Flow

Figure 3:
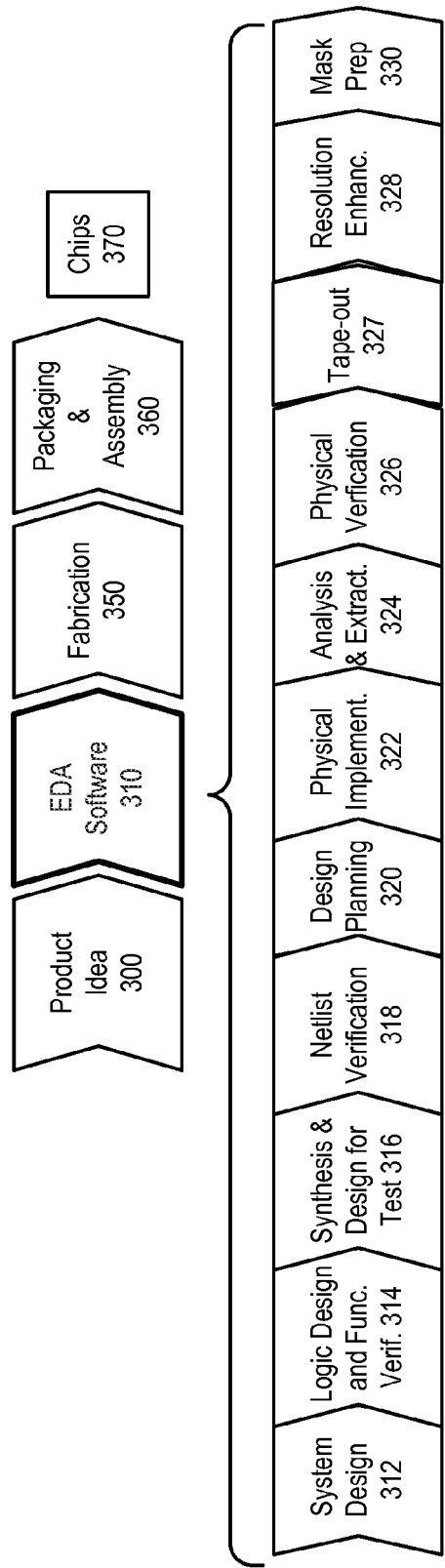
FIG. 3 shows a simplified representation of an illustrative digital integrated circuit design flow incorporating aspects of the invention.

FIG. 3 shows a simplified representation of an illustrative digital integrated circuit design flow incorporating aspects of the invention. At a high level, the process starts with the product idea (step 300) and is realized in an EDA (Electronic Design Automation) software design process (step 310). When the design is finalized, it can be taped-out (step 340). After tape out, the fabrication process (step 350) and packaging and assembly processes (step 360) occur resulting, ultimately, in finished integrated circuit chips (result 370).

The EDA software design process (step 310) is actually composed of a number of steps 312-330, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit. A brief description of the components steps of the EDA software design process (step 310) will now be provided.

System design (step 312): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 314): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality. ESP and LEDA products.

Synthesis and design for test (step 316): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 318): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 320): Here, an overall floor plan for the chip is constructed and analyzed for timing and top-level routing. Example EDA software products from Synopsys, Inc. that can be used at this step include Astro and IC Compiler products.

Physical implementation (step 322): The placement (positioning of circuit elements) and routing (connection of the same), as well as other aspects of circuit layout, occur at this step. Example EDA software products from Synopsys, Inc.

that can be used at this step include the Astro and IC Compiler products. This step usually places library cells which were pre-designed for a particular fabrication process using a software product such as Liberty, available from Synopsys, Inc. Certain aspects of the invention herein can take place during the design of the library cells.

Analysis and extraction (step 324): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 326): At this step various checking functions are performed to ensure correctness for: manufacturing, electrical issues, lithographic issues, and circuitry. Example EDA software products from Synopsys, Inc. that can be used at this step include the Hercules product.

Tape-out (step 327): This step, which in some design flows may be delayed until step 330, provides the "tape-out" data for production of masks for lithographic use to produce finished chips. Example EDA software products from Synopsys, Inc. that can be used at this step include the CATS(R) family of products.

Resolution enhancement (step 328): This step involves geometric manipulations of the layout to improve manufacturability of the design. Example EDA software products from Synopsys, Inc. that can be used at this step include Proteus, ProteusAF, and PSMGen products. Certain aspects of the invention herein can take place during this step as well, or just afterwards.

Mask data preparation (step 330): If not performed prior to resolution enhancement (step 328), this step provides the "tape-out" data for production of masks for lithographic use to produce finished chips.

Figure 4:
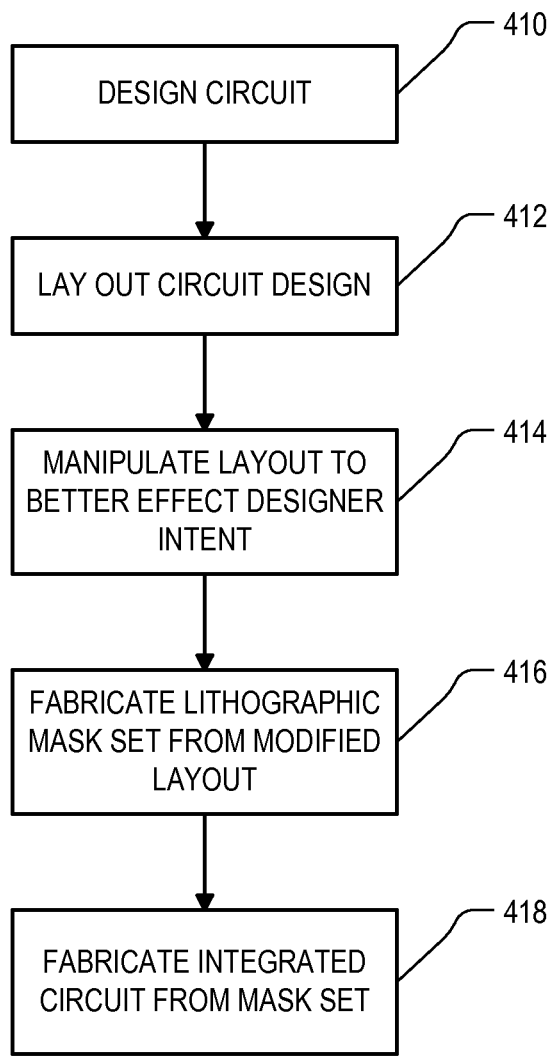
FIG. 4 is a flow chart illustrating aspects of the design flow pertinent to some of the embodiments discussed herein.

FIG. 4 is a flow chart illustrating aspects of the design flow pertinent to some of the embodiments discussed herein. As with all flowcharts herein, it will be appreciated that many of the steps can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied.

Referring to FIG. 4, in step 410 a circuit is designed. Step 410 corresponds roughly to steps 300 and steps 312-318 of FIG. 3. As used herein, the term "circuit design" refers to the gate or transistor level design, after compilation from a Verilog or VHDL design representation or similar, and before layout. The circuit design is represented after step 410 in a netlist file. In step 412, corresponding roughly to steps 320-326 of FIG. 3, the circuit design is laid out. The layout is represented in a geometry file which defines, among other things, all the shapes to be formed on each mask that will be used to expose the wafer during fabrication. The geometry file can have any of several standard formats, such as GDSII, OASIS, CREF, and so on, or it can have a non-standard format. The file describes the layout of the circuit design in the form of a mask definition for each of the masks to be generated. Each mask definition defines a plurality of polygons. At the end of step 412 in the present embodiment, no resolution enhancement (RET) has yet been performed. Thus the layout geometries resulting from step 412 are in a sense idealized, since they do not yet take into account the imperfections of lithographic printing using optical wavelengths comparable or larger in size than the size of the geometries in the layout. For example, rectangles are rectangular, and are not yet pre-corrected for diffractive effects.

In step 414, corresponding roughly to step 328, the layout is revised through a number of steps to better effect designer intent. The intent of the designer is discerned from the idealized layout shapes (such as intended drive current discerned from channel widths), and modifications are made to better achieve that intent in the ultimate integrated circuit. Optical proximity correction occurs in this step, as does the addition of shape engineering bumps or protrusions as described hereinafter. The revised layout is once again represented in a geometry file, typically using one of the geometry file formats above.

In step 416, a lithographic mask set is created based on the modified layout from step 414. The method for making the masks is not a significant aspect of the present invention, so any mask making technique can be used, either known today or developed in the future. As an example, masks can be printed using techniques set forth in U.S. Pat. Nos. 6,096,458; 6,057,063; 5,246,800; 5,472,814; and 5,702,847, all incorporated by referenced herein for their teachings of mask printing techniques.

After the mask set is made, in step 418, integrated circuits are fabricated using them. Again, the particular method used for fabricating an integrated circuit from a mask set is not a significant aspect of the present invention, so any fabrication process can be used, either known today or developed in the future. Preferably a self-aligned technique as described above for doping the source and drain diffusions is used.

Figure 5:
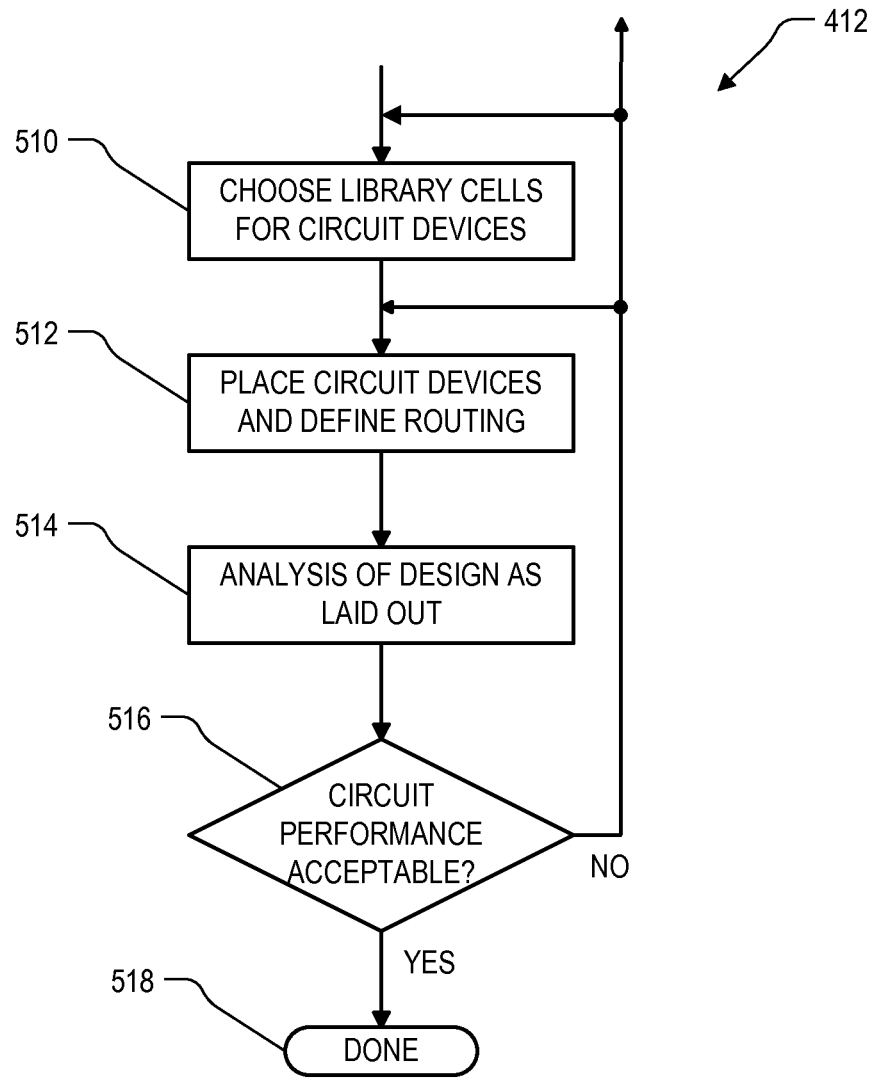
FIG. 5 is a flow chart detail of the step in FIG. 4 for laying out the circuit.

FIG. 5 is a flow chart detail of step 412 for laying out the circuit. FIG. 5 is a. simplification of a highly involved process, most details of which are not important to an understanding of the invention and are not shown in the figure. Referring to FIG. 5, in step 510, library cells are chosen for the individual circuit devices specified in the incoming netlist. The library cells include (among other things) the layout geometries needed for the device, including an arrangement of current path diffusion regions and gate stack (s). For example, one library cell might include the layout shapes 110, 112, 114 and 116 in FIG. 1A, as well as layout shapes for defining several transistors of the opposite channel type.

In step 512, the library cells are placed into the layout and wires are defined to interconnect them in the interconnect layers, according to the circuit design. Numerous factors are taken into account in this step, most of which are not important to an understanding of the invention. In accordance with an aspect of the invention, however, one of the factors considered is that if one of the current path diffusions of a transistor is wider than the other, then it is preferred that the wider one be assigned as the source of the transistor and the narrower one be assigned the drain. The other factors considered in the place-and-route algorithms may override this preference, but at least this preference is considered and included in the place-and-route optimization effort. Once it is decided which current path diffusion region is to be the source and which the drain, interconnect layers are laid out that connect the chosen diffusions to the remainder of the devices in the circuit in dependence upon that choice. Alternatively, if layout shapes are such that two or more transistors of different sizes share current path diffusion regions, and interchanging source and drain to improve one transistor has the opposite effect on another transistor, then in an aspect of the invention the diffusion may be split into two. Each can then be optimized individually, though at the cost of increased chip area.

The layout step 412 is highly iterative. Therefore, in step 514 the circuit as laid out is analyzed for chip area used, timing, power dissipation, and many other factors, and in step 516 it is determined whether the circuit performance is acceptable as laid out. If not, then the process returns to step 512 to try a different placement or routing of circuit devices (including reconsidering the source/drain choices and split diffusions from the previous iteration), or to step 510 to choose different library cells for circuit devices if necessary, or if necessary the process can even return to step 410 (FIG. 4) to modify the design of the circuit in some way. After step 516 determines that circuit performance is acceptable, the layout step 412 is done (step 518).

The general sequence of steps shown in FIG. 5 also applies to the layout of a pre-defined cell for a technology library. The significant differences between laying out a full circuit design and laying out a library cell include that the fundamental building blocks of a full circuit design are library cells, whereas the fundamental building blocks of a library cell are mostly individual transistors.

Figure 5A:
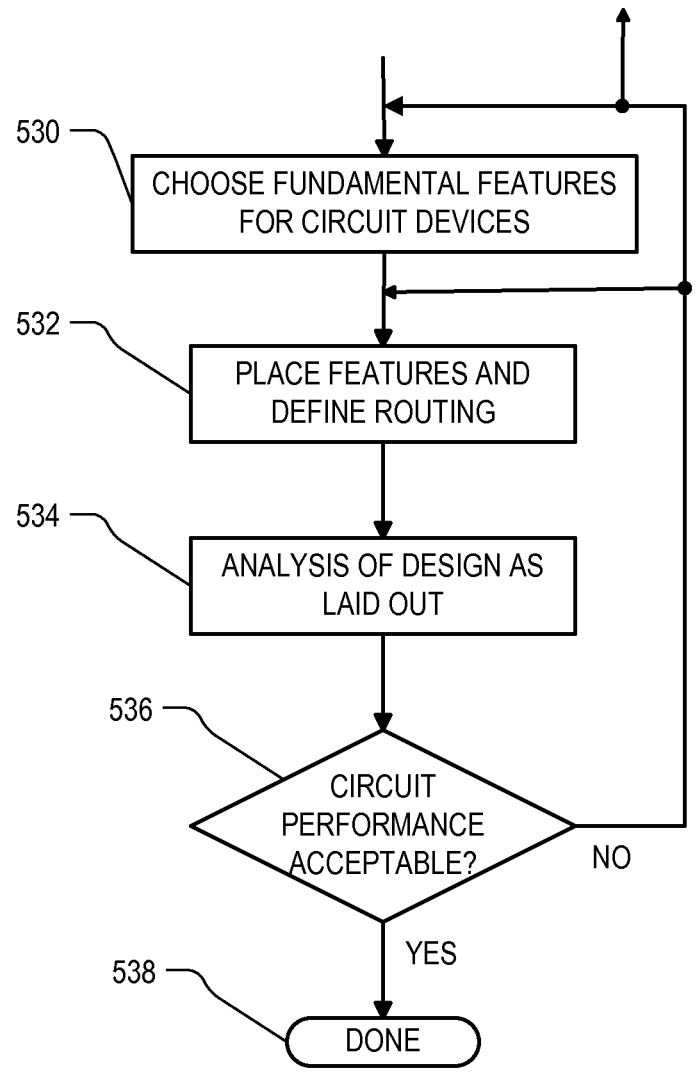
FIG. 5A is a flow chart of a design process for laying out a library cell.

FIG. 5A is a flow chart of a design process for laying out a library cell. Again, FIG. 5A is a simplification of a highly involved process, most details of which are not important to an understanding of the invention and are not shown in the figure. Referring to FIG. 5A, in step 530, fundamental features are chosen for the individual circuit devices specified in the incoming netlist. For the most part the fundamental features are diffusion regions, gate conductors and interconnects. In step 532, the fundamental features are laid out and combined as appropriate according to the library cell circuit design. As with step 512, though numerous factors are taken into account in this step, it is an aspect of the invention that one of the factors considered is that if one current path diffusion of a transistor is wider than the other, then it is preferred that the wider one be assigned as the source of the transistor and the narrower one be assigned the drain. Once it is decided which current path diffusion region is to be the source and which the drain, interconnect layers are laid out that connect the chosen diffusions to the remainder of the devices in the library cell in dependence upon that choice. Alternatively, if layout shapes are such that two or more transistors of different sizes share current path diffusion regions, and interchanging source and drain to improve one transistor has the opposite effect on another transistor, then in an aspect of the invention the diffusion may be split into two. Each can then be optimized individually, though at the cost of increased chip area.

In step 534 the circuit as laid out is analyzed for chip area used, timing, power dissipation, and many other factors, and in step 536 it is determined whether the circuit performance is acceptable as laid out. If not, then the process returns to step 532 to try a. different placement or routing of features (including reconsidering the source/drain choices and split diffusions from the previous iteration), or to step 530 to choose different fundamental features if necessary, or if necessary the process can even return to modify the design of the library cell circuit in some way. After step 536 determines that circuit performance is acceptable, the layout of the library cell is done (step 538).

Shape Engineering of Transistor Channels

As mentioned, diffusion regions having rounded corners extending into the channel region of a transistor can improve Ioff performance of the transistor if the larger diffusion of the transistor is assigned as the source diffusion. A circuit layout can take advantage of this observation by intentionally widening the source region of a transistor in proximity to the gate. It is not the rounded corners themselves that provide the improvement, but the non-rectangular channel which is wider on the source side. Rounded corners are one way to achieve such a channel shape, though the rounding is only a second order effect. The first order effect is the slope, i.e., the source side wider than the drain side.

Figure 6A:
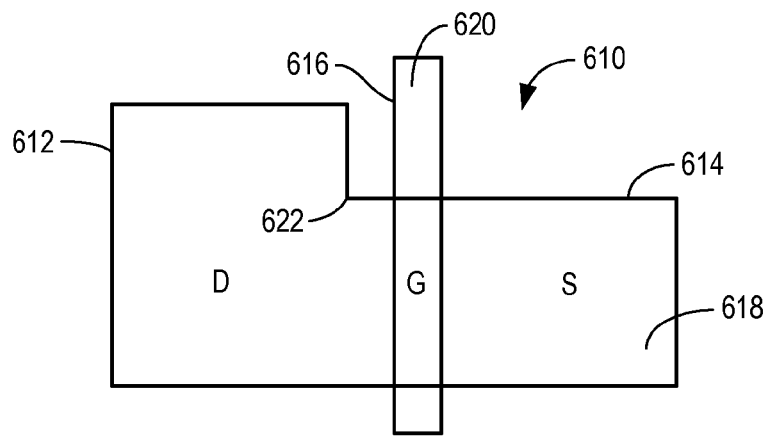
FIGS. 6A, 7A, 8A and 9A illustrate portions of respective integrated circuit layouts, as represented in a layout file.

FIG. 6A is an illustration of a portion of a circuit layout in which one transistor 610 is shown. It comprises first and second current path diffusions 612 and 614 on longitudinally opposite sides of a gate conductor 616. Diffusion region 612 is assigned as the drain, and diffusion region 614 is assigned as the source, and it is assumed that for some reason that assignment of current path terminals is not changeable. The drain diffusion 612 is wider than the source diffusion 614, for reasons not shown in the drawing. For example, another transistor (not shown) may be located within the diffusion region 612, which is required by the circuit design to have a greater drive strength than the transistor that is shown. What is shown in FIG. 6A are diffusion layout shape 618, which is the geometric union of the current path diffusions 612 and 614 and the channel region below the gate conductor 616; and a gate poly layout shape 620. These layout shapes are represented in the layout file after step 412. These layout shapes are also represented (if not altered in step 414) as shapes on the mask set that will be used to fabricate the integrated circuit. For clarity of discussion, the corner 622 of diffusion shape 618 is referred to herein as an "inside" corner because its angle is greater than 180 degrees when viewed from inside the shape 618. An "outside" corner, as used herein, is one in which its angle as viewed from inside the layout shape is less than 180 degrees.

As explained above, it is disadvantageous that the drain diffusion be wider than the source diffusion, because any rounding of the inner corner 622 which extends under the gate 620 can degrade performance, particularly Ioff. Even if the rounding of corner 622 does not extend under the gate 620, Ioff performance can still be improved by causing the channel diffusion under the gate to widen toward the source diffusion 618. This can be accomplished in a number of different ways, and FIG. 6B illustrates one way of accomplishing it.

Figure 6B:
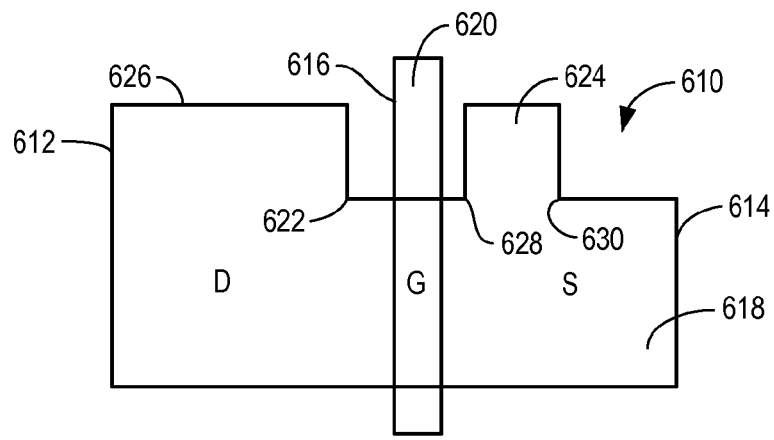
FIGS. 6B, 7B, 8B and 9B illustrate portions of integrated circuit layouts corresponding to FIGS. 6A, 7A, 8A and 9A, respectively, after modification according to aspects of the invention, as represented in a layout file or in a lithographic mask set.

As with FIG. 6A, FIG. 6B is also an illustration of diffusion layout shapes as represented in a layout file and (if no other manipulations are performed in step 414) on the mask set that will be used to fabricate the integrated circuit. To the extent other manipulations are performed in step 414, the shapes in FIG. 6B illustrate shapes on the mask set with such manipulations excluded for clarity of illustration. It can be seen that a "bump" or "protrusion" 624 has been added to the diffusion layout shape 618, extending transversely outward on one of the longitudinal sides 626 of the diffusion layout shape 618, longitudinally on the source side of the gate 616. The protrusion 624 has two inner corners 628 and 630, the corner 628 being referred to herein as the one "proximal" to the gate conductor 616, and the corner 630 being referred to herein as the one "distal" to the gate conductor 616. The transversely oriented side of the protrusion 624 which is proximal to the gate conductor is also sometimes referred to herein as a "jog". The proximal corner 628 of the protrusion 624 is disposed on the layout sufficiently near to the gate 616 such that during printing onto the integrated circuit, when corner 628 rounds due to optical diffractive effects, the rounded corner will extend at least part way under the gate 616. Optical proximity correction and/or other resolution enhancement mechanisms can be turned off for this corner in order to avoid interfering with the expected rounding, or can be allowed to proceed for this corner if it enhances the extent of the corner rounding under the gate, or otherwise modifies it in a characterizable manner.

Note that shapes in a layout arc considered herein to be proximal or distal from one another, or to cross one another (as gate 620 "crosses" diffusion layout shape 618), even though they may be formed on different layers or different masks in the mask set. It is the geometric relationships in the plan view, when the layers or masks are superimposed on one another, that defines "proximal", "distal" and "crossings" as the terms are used herein. Additionally, coincidence is considered herein to be merely a special case of "proximal", not distinguished from it.

Figure 6C:
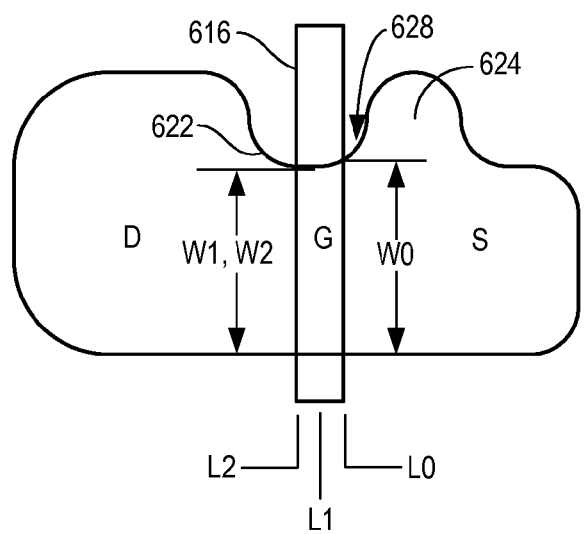
FIGS. 6C, 7C, 8C and 9C illustrate portions of integrated circuit devices fabricated using the layout portions of FIGS. 6B, 7B, 8B and 9B, respectively.

FIG. 6C illustrates the shape of the source, drain and channel regions on an integrated circuit device formed using a mask set containing layout shapes as shown in FIG. 6B. It can be seen that inner corner 628 has rounded, and the rounding extends partially under the gate conductor 616. More particularly, where the source diffusion meets the channel diffusion at a longitudinal position L0, the width of the channel at longitudinal position is W0. There is another longitudinal position L1 within the channel region, at which the width of the channel is W1. Because of the rounding of corner 628, W1<W0. In the embodiment of FIGS. 6B and 6C, the width of the channel W2 at the longitudinal position. L2 where the channel region meets the drain diffusion, is the same as W1 since the rounding of corner 622 does not extend under the gate 616. However, in another embodiment, W2 can be larger than W1.

As used herein, no distinction is intended between substances of an integrated circuit which are disposed in the substrate body itself, or disposed in an overlying layer. For example, all of the features of an integrated circuit, including wells, diffusions, STI regions, gate dielectric layers, gate conductors, metal layers and cap layer materials, are all described equivalently herein as being either "on" the substrate or"in" the substrate, and no distinction is intended between the two words. Additionally, as used herein, the terms "overlie" and "underlie" do not preclude the presence of one or more materials or layers in between.

Figure 7A:
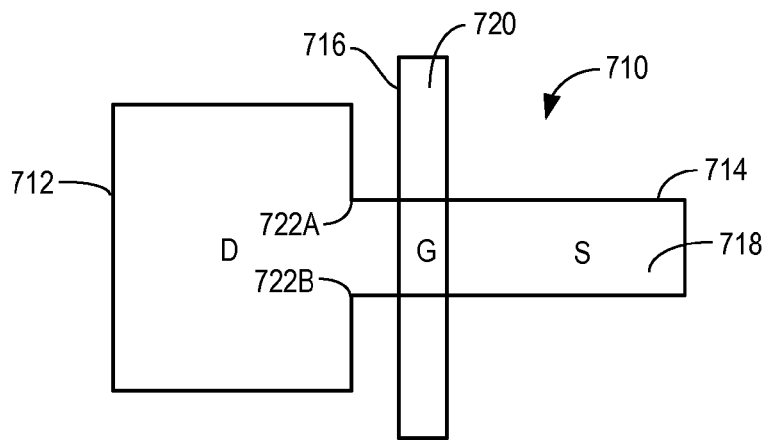

FIG. 7A is an illustration of another portion of a circuit layout in which one transistor 710 is shown. It comprises first and second current path diffusions 712 and 714 on longitudinally opposite sides of a gate conductor 716. As in FIG. 6A, diffusion region 712 is assigned as the drain, and diffusion region 714 is assigned as the source, and it is assumed that for some reason that assignment of current path terminals is not changeable. The drain diffusion 712 is wider than the source diffusion 714, for reasons not shown in the drawing. FIG. 7A shows the diffusion layout shape 718, which is the geometric union of the current path diffusions 712 and 714 and the channel region below the gate conductor 716; and a gate poly layout shape 720. These layout shapes are represented in the layout file after step 412. These layout shapes (excluding other alterations in step 414) are also represented as shapes on the mask set that will be used to fabricate the integrated circuit.

Figure 7B:
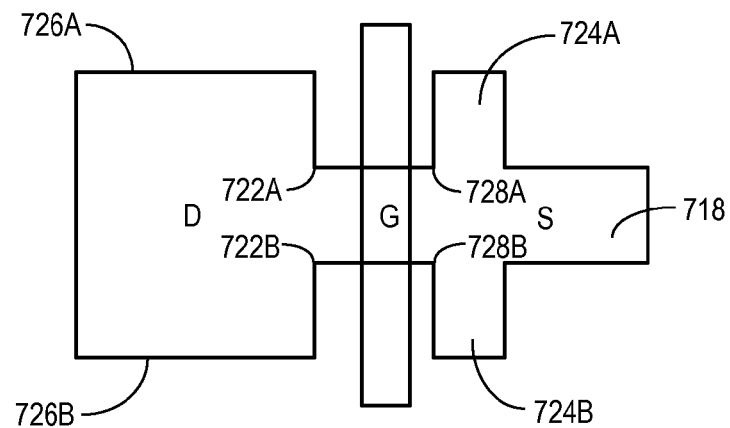

FIG. 7B is also an illustration of diffusion layout shapes as represented in a layout file and (excluding any other manipulations performed in step 414) on the mask set that will be used to fabricate the integrated circuit. FIG. 7B differs from FIG. 6B in that it illustrates that protrusions can be added on both transversely opposite longitudinal sides of the diffusion layout shape, not just one side as in FIG. 6B. Thus it can be seen that a protrusion 724A has been added to the diffusion layout shape 718, extending transversely outward on one of the longitudinal sides 726A of the diffusion layout shape 718, longitudinally on the source side of the gate 716. A second protrusion 724B has been added to the diffusion layout shape 718, extending transversely outward on the other longitudinal side 726B of the diffusion layout shape 718, also longitudinally on the source side of the gate 716. The two protrusions 724A. and 724B are said herein to be disposed on "transversely opposite" longitudinal sides 726A and 726B of the diffusion layout shape 718.

The proximal inner corner of protrusion 724A is corner 728A, and the proximal inner corner of protrusion 724B is corner 728B. Both are disposed on the layout sufficiently near to the gate 716 such that during printing onto the integrated circuit, when corners 728A and 728B round due to optical diffractive effects, the rounded corners will extend at least part way under the gate 716.

Figure 7C:
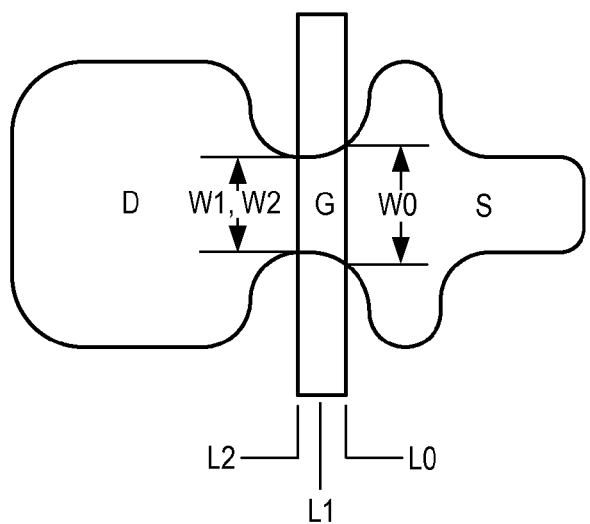

FIG. 7C illustrates the shape of the source, drain and channel regions on an integrated circuit device formed using a mask set containing layout shapes as shown in FIG. 7B. It can be seen that inner corners 728A and 728B have rounded, and the rounding extends partially under the gate conductor 716. More particularly, where the source diffusion meets the channel diffusion at a longitudinal position L0, the width of the channel at longitudinal position is W0. There is another longitudinal position L1 within the channel region, at which the width of the channel is WI. Because of the rounding of corners 728A and 728B, W1<W0. Effectively the channel has been widened on both transversely opposite sides of the channel where the channel meets the source diffusion. As with the embodiment of FIGS. 6B and 6C, in the embodiment of FIGS. 7B and 7C, the width, of the channel. W2 at the longitudinal position L2 where the channel region meets the drain diffusion, is the same as W1 since the rounding of corners 722A and 722B, which arc proximal to the gate conductor 716 longitudinally on the drain side of the diffusion layout shape 718, do not extend under the gate 716.

Figure 8A:
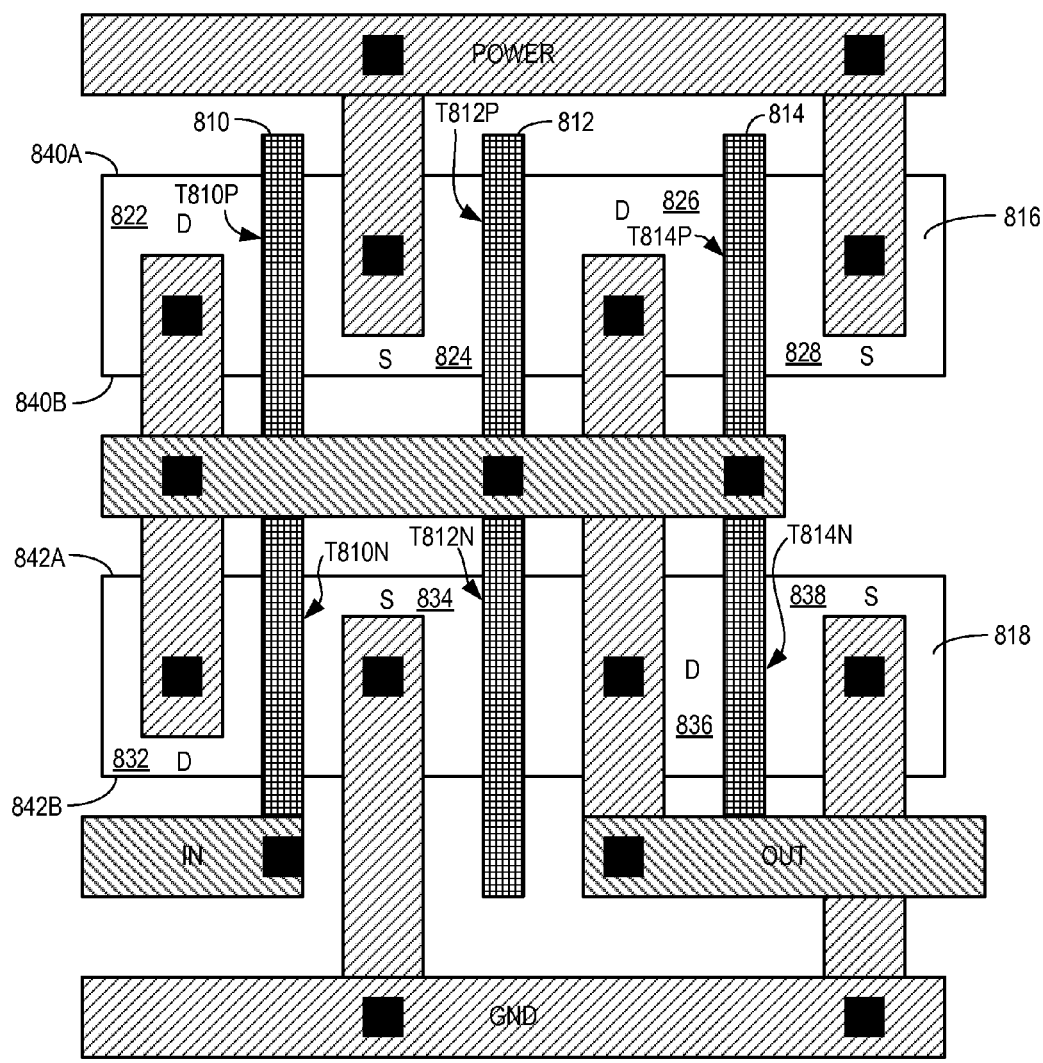

Source-widening protrusions can be added also where the drain is not wider than the source as originally laid out. FIG. 8A is an illustration of a portion of a circuit layout for a 2× buffer, the circuit symbol for which is shown in FIG. 8D. It includes three gate conductor shapes 810, 812 and 814 crossing both a P-channel diffusion layout shape 816 and an N-channel diffusion layout shape 818, to form respective transistors T810P, T812P and T814P in the P-channel diffusion layout shape 816, and respective transistors T810N, T812N and T814N in the N-channel diffusion layout shape 818. In P-channel diffusion layout shape 816, therefore, the gate conductor shapes define current path diffusion regions 822, 824, 826 and 828. In N-channel diffusion layout shape 818, the gate conductor shapes define current path diffusion regions 832, 834, 836 and 838. Layout shapes for a first layer of metal interconnects are shown for connecting diffusion 822 and 832 together, connecting diffusions 826 and 836 together, connecting diffusions 824 and 828 to a power bus, and connecting diffusions 834 and 838 to a ground bus. Layout shapes for a second layer of metal interconnects are shown for connecting the signal input terminal to gate conductor 810, connecting diffusions 822 and 832 to both gate conductors 812 and 814, and for connecting the signal output terminal to diffusions 826 and 836. Because of these interconnections, diffusion region 822 is connected as the drain of transistor T810P, and diffusion region 824 is connected as the source. These interconnections are shown in FIG. 8E, which is a transistor level circuit diagram of the 2× buffer of FIG. 8D.

As further shown in FIG. 8A, source region 824 is shared as the source region of transistor T812P, and diffusion region 826 is its drain. Drain region 826 is shared as the drain region of transistor T814P, and diffusion region 828 is its drain. Similarly, diffusion region 832 is connected as the drain of transistor T810N, and diffusion region 834 is connected as the source. Source region 834 is shared as the source region of transistor T812N, and diffusion region 836 is its drain. Drain region 836 is shared as the drain region of transistor T814N, and diffusion region 838 is its drain. Unlike FIGS. 6A and 7A, the two transversely opposite longitudinal sides 840A and 840B of diffusion layout shape 816 do not jog, but rather are straight along the entire length of the diffusion layout shape 816 longitudinally. Similarly, the two transversely opposite longitudinal sides 842A and 842B of diffusion layout shape 818 do not jog, but rather are straight along the entire length of the diffusion layout shape 818 longitudinally. As for FIGS. 6A and 7A, the layout shapes shown in FIG. 8A are represented in a layout file after step 412. These layout shapes are also represented (if not altered in step 414) as shapes on the mask set that will be used to fabricate the integrated circuit.

Figure 8B:
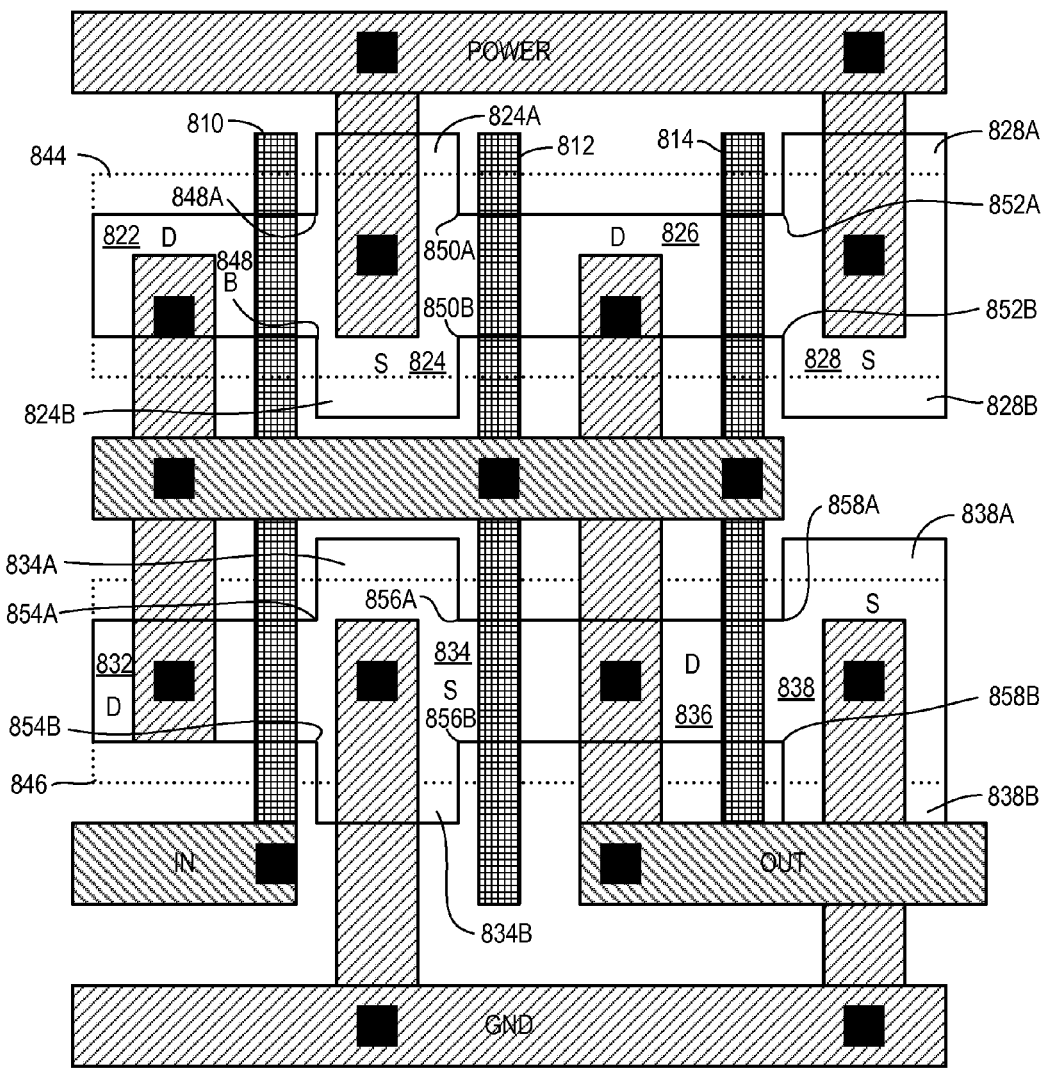

FIG. 8B is an illustration of diffusion layout shapes as represented in a layout file and (excluding any other manipulations performed in step 414) on the mask set that will be used to fabricate the integrated circuit. As in FIG. 7B, protrusions have been added in FIG. 8B on both transversely opposite longitudinal sides of the diffusion layout shape in each of the source diffusion regions 824, 828, 834 and 838. Thus protrusions 824A and 824B have been added on transversely opposite sides of source region 824; protrusions 828A and 828B have been added on transversely opposite sides of source region 828; protrusions 834A and 834B have been added on transversely opposite sides of source region 834; and protrusions 838A and 838B have been added on transversely opposite sides of source region 838. The channel widths and drain diffusions of all the transistors have also been narrowed compared to their original widths, which are shown as dotted lines 844 (P-diffusions) and 846 (N-diffusions). Together with the widening of the source regions due to the added protrusions, this has the effect of retaining the same average channel widths as in the original layout of FIG. 8A. Retention of the average channel width may be desirable for certain design goals, but not for others. The protrusions 824A and 824B have respective inner corners 848A and 848B which are proximal to the gate conductor 810, and also have respective inner corners 850A and 850B which are proximal to the gate conductor 812. Protrusions 828A and 828B have respective inner corners 852A and 852B which are proximal to the gate conductor 814. Similarly, the protrusions 834A and 834B have respective inner corners 854A and 854B which are proximal to the gate conductor 810, and also have respective inner corners 856A and 856B which are proximal to the gate conductor 812. Protrusions 838A and 838B have respective inner corners 858A and 858B which are proximal to the gate conductor 814. All of the inner corners 848A, 848B, 850A, 850B, 852A, 852B, 854A, 854B, 856A, 856B, 858A and 858B are disposed on the layout sufficiently near to the respective gate to which they are proximal, such that during printing onto the integrated circuit, when these corners round due to optical diffractive effects, the rounded corners will extend at least part way under the respective gate conductor 810, 812 or 814.

Figure 8C:
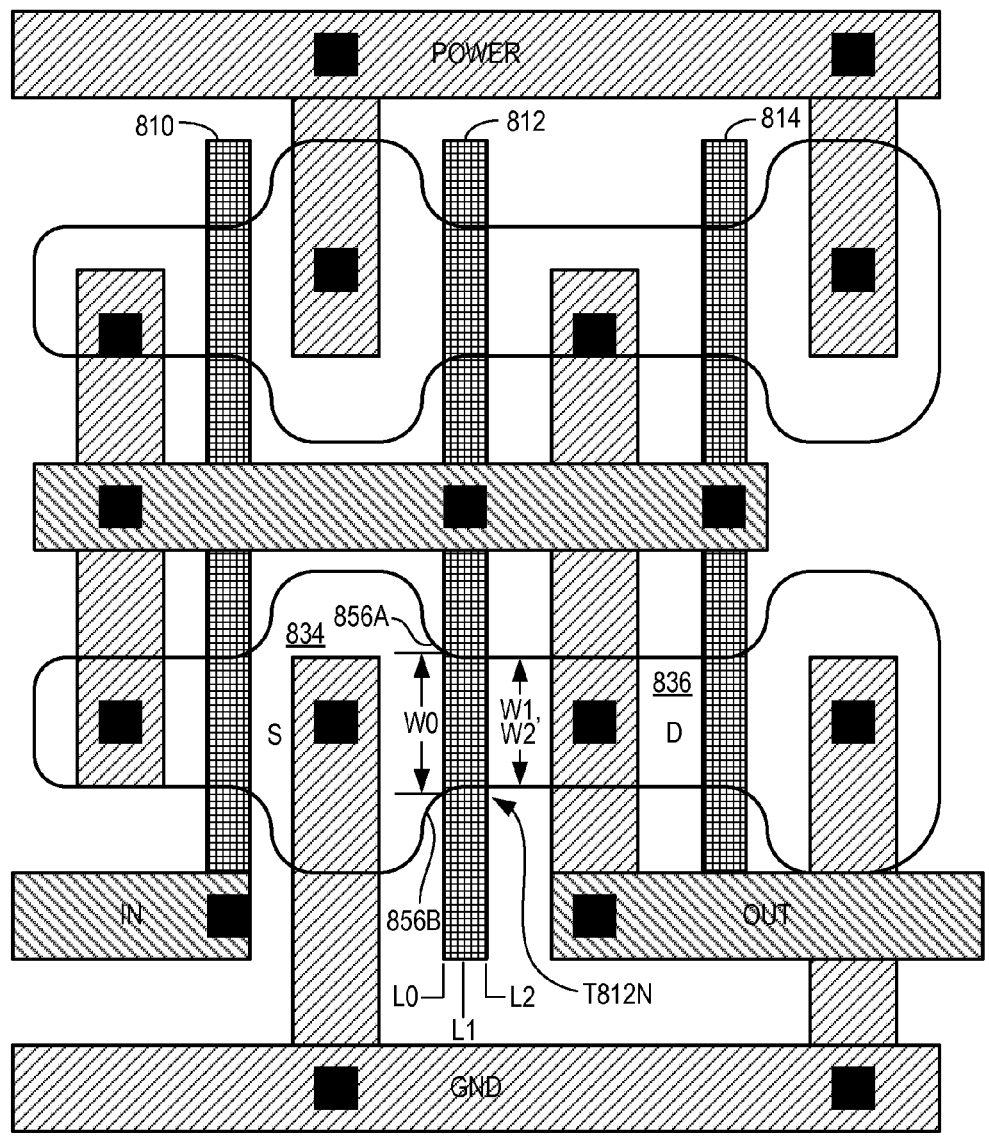
Figure 8D:
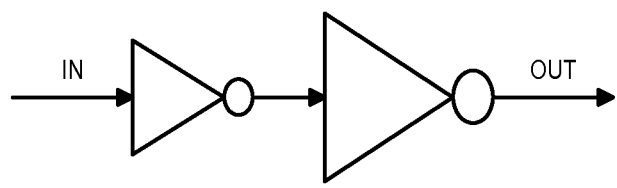
FIG. 8D is a circuit symbol for the circuit laid out in FIGS. 8A and 8B.
Figure 8E:
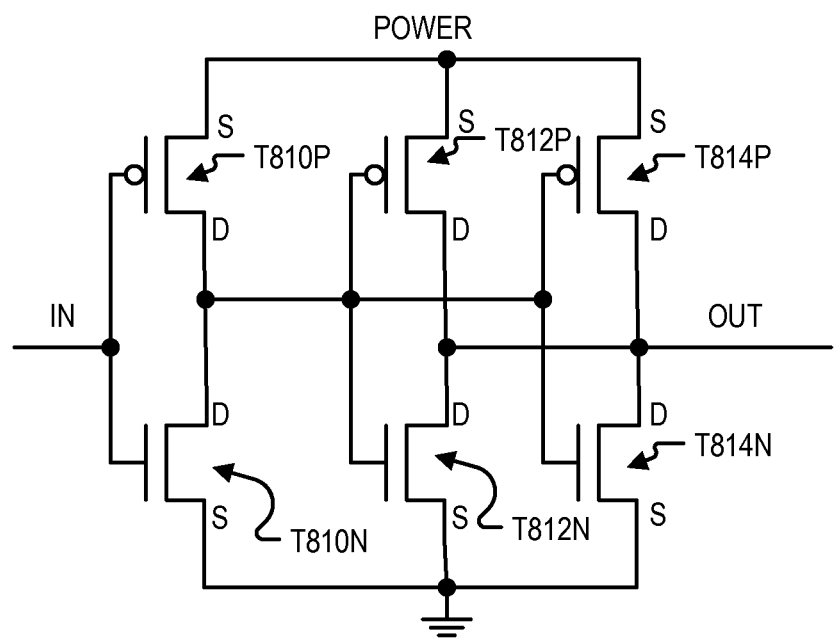
FIG. 8E is a transistor level circuit diagram of the circuit laid out in FIGS. 8A and 8B.

FIG. 8C illustrates the shape of the source, drain and channel diffusions, and the polysilicon gates and metal interconnects, on an integrated circuit device formed using a mask set containing layout shapes as shown in FIG. 8B. It can be seen that all the inner corners have rounded, and the rounding extends partially under their respective proximal gate conductor 810, 812 or 814. More particularly, (and as illustrated with respect to transistor T812N as an example), where the source diffusion 834 meets the channel diffusion at a longitudinal position L0, the width of the channel at longitudinal position is W0. There is another longitudinal position L1 longitudinally within the channel region, at which the width of the channel is W1. Because of the rounding of corners 856A and 856B, W1<W0. Effectively the channel has been widened where the channel meets the source diffusion, and narrowed where it meets the drain region.

In addition to protrusions extending source diffusion regions transversely, in some cases there may also be a reason to extend drain diffusion regions transversely as well. For example, for P-channel transistors with SiGe diffusion regions, wider current path diffusions can increase beneficial stress in the neighborhood, thereby enhancing carrier mobility. The same is true for N-channel transistors with Si:C diffusion regions. This improvement is observed regardless of whether the protrusions are added to the source diffusion or the drain diffusion, and in fact is most significant if added to both diffusions.

Figure 9A:
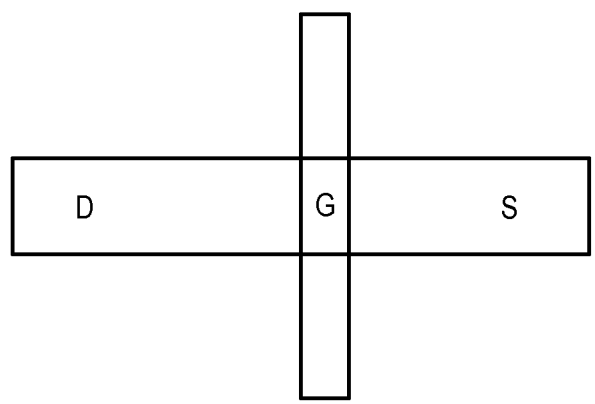
Figure 9B:
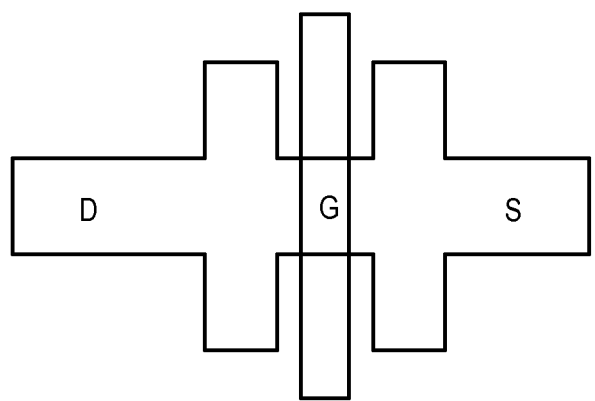
Figure 9C:
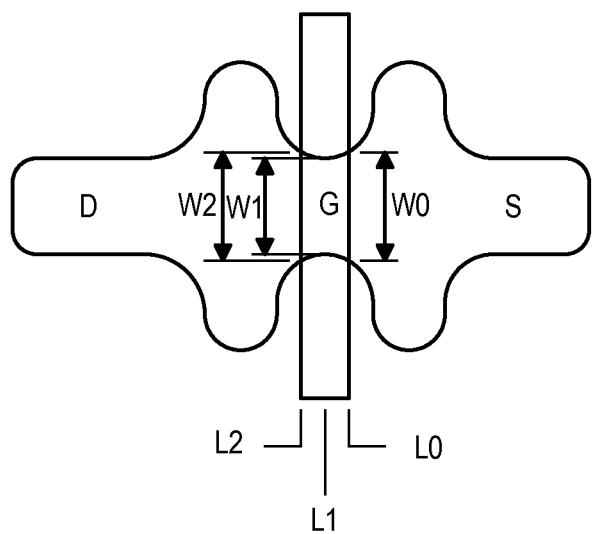

FIGS. 9A, 9B and 9C illustrate a transistor layout that takes advantage of this observation. Again, FIG. 9A illustrates the original layout shapes as represented in the layout file after step 412. These layout shapes (excluding any other alterations in step 414) are also represented as shapes on the mask set that will be used to fabricate the integrated circuit. Source and drain regions are shown, as is the gate layout shape for defining the channel. FIG. 9B illustrates the layout shapes after the addition of transversely extending protrusions on both transverse sides of the diffusion layout shape, and in both the source and drain regions. Again, the inner corners of the protrusions proximal to the gate layout shape are disposed sufficiently near to (or under) the gate layout shape such that during printing onto the integrated circuit, when proximal inner corners round due to optical diffractive effects, these rounded corners will be at least partially under the gate conductor. Note the same effect can be achieved with a transversely intruding cut-out rather than two transversely extending protrusions.

FIG. 9C illustrates the shape of the source, drain and channel diffusions on an integrated circuit device formed using a mask set containing layout shapes as shown in FIG. 9B. It can be seen that all four proximal inner corners have rounded, and the rounding extends partially under the gate conductor. More particularly, where the source diffusion meets the channel diffusion at a longitudinal position L0, the width of the channel at longitudinal position is W0. There is another longitudinal position L1 longitudinally within the channel region, at which the width of the channel is W1, and where the drain diffusion meets the channel diffusion at longitudinal position L2, the width of the channel is W2. Because of the rounding of the four proximal inner corners, W1<W0 and W1<W2. In the embodiment of FIG. 9C it is further true that W0=W2, but that is not essential in all embodiments of the invention.

In most of the embodiments described above, the transversely extending jog which has been introduced is disposed longitudinally on the source side of the gate layout shape. As a result of the jog, an inside corner proximal to the gate layout shape, rounds during lithographic projection onto the device, and thereby extends partly into the channel region. FIG. 10A illustrates that another way that a non-rectangular channel can be achieved based on the original layout of FIG. 6A. In FIG. 10A a protrusion 1010 is added similarly to protrusion. 624 (FIG. 6), but the jog 1012 is disposed longitudinally on the drain side of the gate layout shape. As a result of the jog, an outside corner 1014 of the jog rounds during lithographic projection onto the device, and thereby extends partly into the channel region. This is shown in FIG. 10B. It is noted that a jog like jog 1012 can be considered due to the added protrusion. 1010 or due to a transversely intruding cut-out 1016; either description is accurate.

FIG. 11A illustrates yet another way that a non-rectangular channel can be achieved based on the original layout of FIG. 6A. In FIG. 11A a protrusion 1110 is added similarly to protrusion 624 (FIG. 6), but the jog 1112 is disposed longitudinally between the source and drain diffusion regions, within the channel as will be defined by the gate layout shape. As a result of this jog, both the inside corner 1114 and the outside corner 1116 of the jog will be located at least partly within the channel region, even after diffractive rounding of the two corners. This is shown in FIG. 11B.

FIG. 12A illustrates two other variations that can be used to achieve a non-rectangular channel that a transversely intruding cut-out can be used on the drain side rather than a protrusion on the source side, and that two or more jogs can be used in stair-step fashion. Either variation can be used independently, or they can be used together as in FIG. 12A. In FIG. 12A a protrusion 1210 is added similarly to protrusion 624 (FIG. 6), with the jog 1212 disposed longitudinally in the source diffusion region. The jog 1212 has an inner corner 1214 proximal to the gate layout shape, which is disposed sufficiently near the gate layout shape longitudinally such that when the inner corner 1214 rounds due to diffractive effects during lithograph exposure, the inner corner 1214 will extend partly into the channel region. This can be seen in FIG. 12B. In addition, a cut-out 1216 has been made in the diffusion layout shape, with a proximal jog 1218 disposed longitudinally in the drain diffusion region. The jog 1218 has an outer corner 1220 which is proximal to the corner 1214 in the transverse direction, and is disposed sufficiently near the gate layout shape longitudinally such that when the outer corner 1220 rounds due to diffractive effects during lithograph exposure, the outer corner 1220 will extend partly into the channel region. This too can be seen in FIG. 12B.

It will be appreciated that all the variations illustrated in FIGS. 10A, 11A and 12A could be applied equally to FIGS. 7B, 8B and 9B. Many other variations exist as well, including variations such as that shown in FIG. 12A in which one or both of the jogs 1212 and 1218 occur longitudinally under the gate layout shape, and variations that include three or more jogs. Other variations include those in which jogs occur also on the opposite longitudinal side of the diffusion layout shape. Also, if supported by the layout software and the mask-making process, jogs can also be made diagonal rather than rectilinear.

Design Flow for Introducing Non-Rectangularity in Channels

Figure 13:
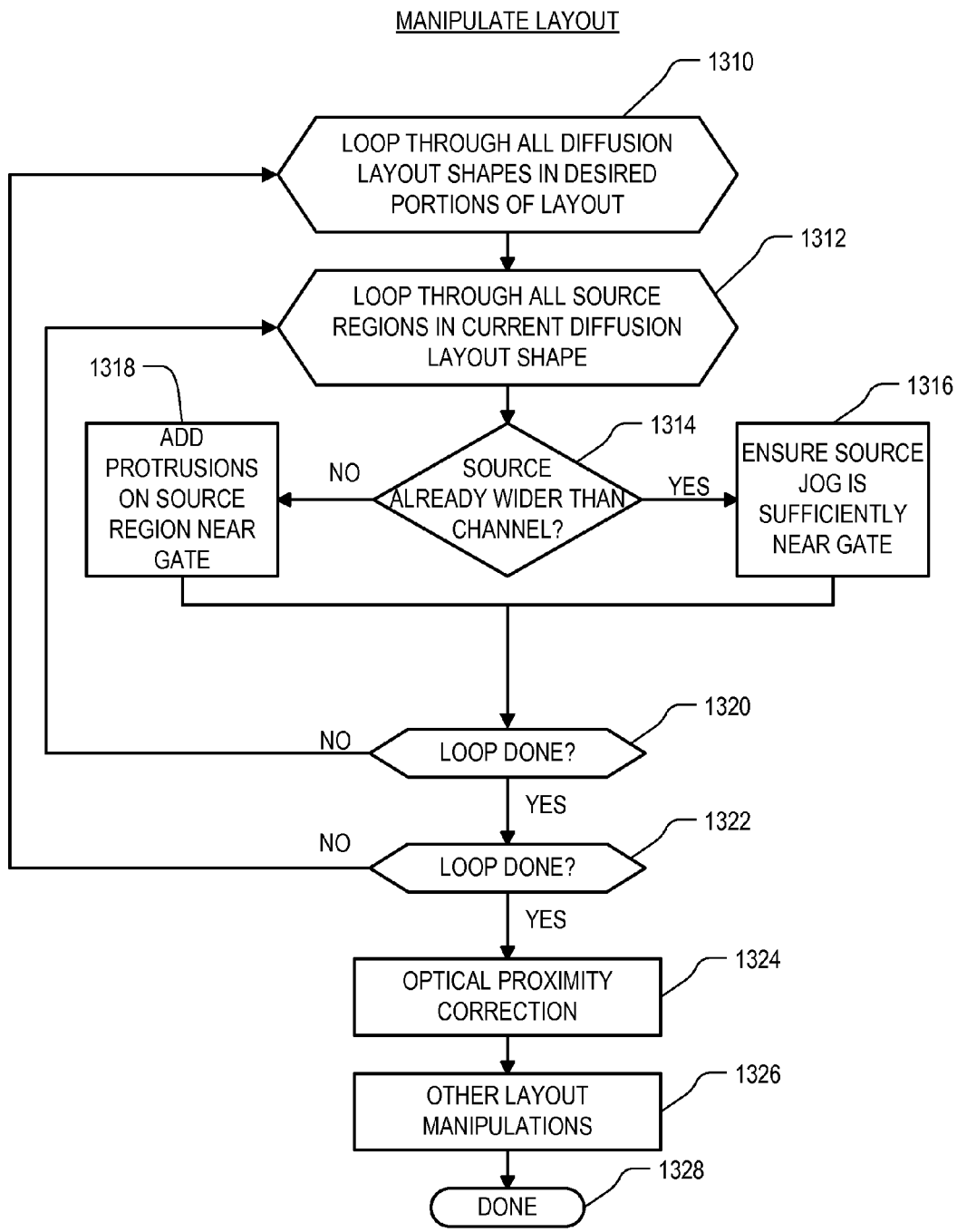
FIG. 13 is a flow chart detail of the step in FIG. 4 for making layout revisions to improve Ioff current.

Returning to FIG. 4, the step of introducing non-rectangularity into transistor channels, such as is shown in FIGS. 6C, 7C and 8C, can be performed during step 414, the manipulation of the layout to better effect designer intent. FIG. 13 is a flow chart detail of step 414, specifically for making layout revisions to improve Ioff current. The steps of FIG. 13 can be performed as part of step 512 (FIG. 5) or step 532 (FIG. 5A). It will be apparent to the reader how to modify FIG. 13 to also improve carrier mobility due to stress effects as described above with respect to FIG. 9B. Referring to FIG. 13, in a step 1310, the system begins a loop through all diffusion layout shapes that are targeted for the introduction of rounded corners extending under transistor gate conductors. This may be all the diffusion layout shapes in a particular portion of the overall layout, or they may be selected by some other characteristic or characteristics. In step 1312, an inner loop is begun through all the diffusion sub-regions in the present diffusion layout shape which have been designated as source diffusions. In step 1314, it is determined whether the present source diffusion is already wider than the channel. If it is, then no additional protrusions are necessary. Instead, in step 1316, the jog in the diffusion layout shape in the source region, and proximal to the gate conductor, is moved as close as possible to the longitudinal position of the gate conductor (if not already there) without unduly risking that a slightly misaligned stepper will print the jog itself superimposed with the gate conductor. The intent is to cause the proximal inner corner of the jog, after rounding during printing onto the integrated circuit, to extend at least partially under the gate conductor.

On the other hand, if the source is as wide or narrower than the channel, then in step 1316, protrusions such as those shown in FIGS. 6B, 7B, 8B are added to the diffusion layout shape on the same side of the gate conductor as the source region longitudinally. Again, a longitudinal position is chosen which is sufficiently close to the gate conductor so as to cause the proximal inner corner of the protrusion, after rounding during printing onto the integrated circuit, to extend at least partially under the gate conductor, but not so close as to unduly risk that a slightly misaligned stepper will print the protrusion itself superimposed with the gate conductor. It will be appreciated that in one embodiment the protrusions may be added on only one side of the source region transversely, whereas in a different embodiment the protrusions may be added on both opposite sides of the source region transversely.

After any movement of the source region jog in step 1316, or the addition of any protrusions in step 1318, it is determined in step 1320 whether there are any more source regions in the current diffusion layout shape. If so, then the system returns to step 1312 to consider the next source region in the current layout shape. If not, then in step 1322 the system determines whether there are any more diffusion layout shapes to consider. If so, then the system returns to step 1310 to consider the next diffusion layout shape.

After all desired diffusion layout shapes have been considered, optical proximity correction of various shapes in the layout can be added in step 1324. As mentioned, optical proximity correction and/or other resolution enhancement mechanisms can be turned off for each of the corners affected or considered in steps 1316 or 1318 in order to avoid interfering with the expected rounding, or can be allowed to proceed for these corners if it enhances the extent of the corner rounding under the gate, or otherwise modifies it in a characterizable manner. Finally, in step 1326, any other resolution enhancement or other manipulations to the layout can be performed. Note that step 1326 can be performed partially or entirely prior to step 1324 or even step 1310, or even within one or both of the loops 1310 and 1312, to the extent they do not alter the expected rounding, or do alter it but in a characterizable manner. Preferably the optical proximity correction step 1324 occurs only after step 1322, but with appropriate considerations it can be performed earlier in a particular embodiment. The step of manipulating the layout completes in step 1328.

Figure 14:
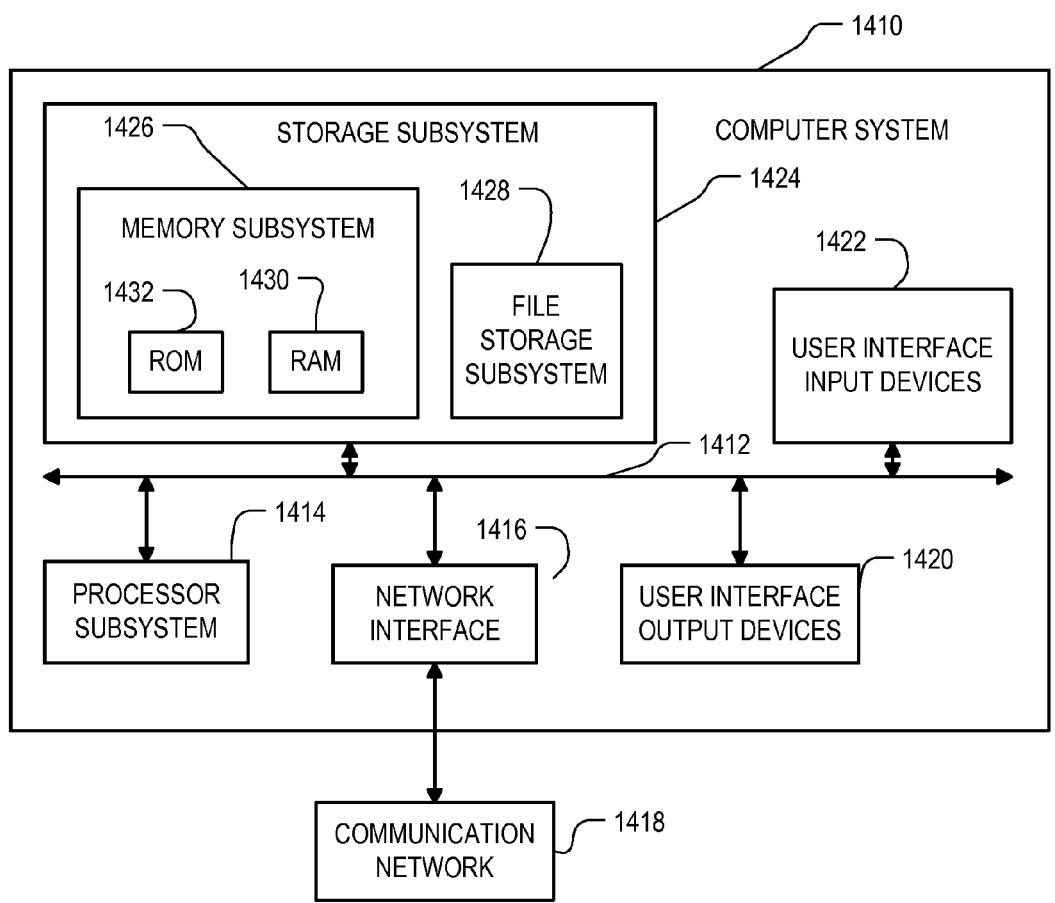
FIG. 14 is a simplified block diagram of a computer system that can be used to implement software incorporating aspects of the present invention.

FIG. 14 is a simplified block diagram of a computer system 1410 that can be used to implement software incorporating aspects of the present invention. Computer system 1410 includes a processor subsystem 1414 which communicates with a number of peripheral devices via bus subsystem 1412. These peripheral devices may include a storage subsystem 1424, comprising a memory subsystem 1426 and a file storage subsystem 1428, user interface input devices 1422, user interface output devices 1420, and a network interface subsystem 1416. The input and output devices allow user interaction with computer system 1410. Network interface subsystem 1416 provides an interface to outside networks, including an interface to communication network 1418, and is coupled via communication network 1418 to corresponding interface devices in other computer systems. Communication network 1418 may comprise many interconnected computer systems and communication links. These communication links may be wireline links, optical links, wireless links, or any other mechanisms for communication of information. While in one embodiment, communication network 1418 is the Internet, in other embodiments, communication network 1418 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1422 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1410 or onto computer network 1418.

User interface output devices 1420 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1410 to the user or to another machine or computer system.

Storage subsystem 1424 stores the basic programming and data constructs that provide the functionality of certain embodiments of the present invention. For example, the various modules implementing the functionality of certain embodiments of the invention may be stored in storage subsystem 1424. These software modules are generally executed by processor subsystem 1414.

Memory subsystem 1426 typically includes a number of memories including a main random access memory (RAM) 1430 for storage of instructions and data during program execution and a read only memory (ROM) 1432 in which fixed instructions are stored. File storage subsystem 1428 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 1428. The host memory 1426 contains, among other things, computer instructions which, when executed by the processor subsystem 1414, cause the computer system to operate or perform functions as described herein. As used herein, processes and software that are said to run in or on "the host" or "the computer", execute on the processor subsystem 1414 in response to computer instructions and data in the host memory subsystem 1426 including any other local or remote storage for such instructions and data.

Bus subsystem 1412 provides a mechanism for letting the various components and subsystems of computer system 1410 communicate with each other as intended. Although bus subsystem 1412 is shown schematically as a single bus, alternative embodiments of the bus subsystem may use multiple busses.

Computer system 1410 itself can be of varying types including a personal computer, a portable computer, a workstation, a computer terminal, a network computer, a television, a mainframe, or any other data processing system or user device. Due to the ever-changing nature of computers and networks, the description of computer system 1410 depicted in FIG. 14 is intended only as a specific example for purposes of illustrating certain embodiments of the present invention. Many other configurations of computer system 1410 are possible having more or less components than the computer system depicted in FIG. 14.

The steps set forth in FIGS. 5 and 13 are performed by a computer system having a processor such as processor subsystem 1414 and a memory such as storage subsystem 1424, under the control of software which includes instructions which are executable by the processor subsystem 1414 to perform the steps shown. The software also includes data on which the processor operates. The software is stored on a computer readable medium, which as used herein, is one on which information can be stored and read by a computer system. Examples include a floppy disk, a hard disk drive, a. RAM, a CD, a DVD, flash memory, a USB drive, and so on. The computer readable medium may store information. in coded formats that are decoded for actual use in a particular data processing system. A single computer readable medium, as the term is used herein, may also include more than one physical item, such as a plurality of CD-ROMs or a plurality of segments of RAM, or a combination of several different kinds of media. When the computer readable medium storing the software is combined with the computer system of FIG. 14, the combination is a machine which performs the steps set forth herein. Means for performing each step consists of the computer system (or only those parts of it that are needed for the step) in combination with software modules for performing the step. The computer readable medium storing the software is also capable of being distributed separately from the computer system, and forms its own article of manufacture.

Additionally, the netlist file or files containing a representation of the circuit design, and the geometry file or files storing the layouts, both after step 412 and after step 414, are themselves stored on computer readable media. Such media are distributable separately from the computer system, and form their own respective articles of manufacture. When combined with a computer system programmed with software for reading, revising and writing the netlist or geometry files they form yet another machine which performs the steps set forth herein.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, whereas one method of forming rounded corners extending under a gate involves adding protrusions to layout shapes as shown in FIGS. 6B, 7B, 8B and 9B, it will be appreciated that other methods can be used as well. In particular, for example, inverse lithography techniques can be used instead. Inverse lithography is described in the following articles, both incorporated herein by reference: Milanfar, Borodovsky and Poonawala, "Double exposure inverse lithography" (November 2007), available at http://www.solid-state.com/display_article/311162/28/ARTCL/none/none/1/Double-exposure-inverse-lithography; and Aaron Hand, "Inverse Lithography Makes New Inroads in RET" (May 1, 2007), available at http://www.semiconductor.net/article/CA6434690.html. Additionally, protrusions added to a layout shape need not necessarily be rectangular as shown in FIGS. 6B, 7B, 8B and 9B. Furthermore, without limitation, any and all variations described, suggested or incorporated by reference in the Background section of this patent application are specifically incorporated by reference into the description herein in order to help express the breadth of techniques by which embodiments of the invention can be implemented. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim as follows:

1. A method for revising a layout of a circuit design, for use in forming a set of lithographic reticles for use in fabricating an integrated circuit, the method being for use by a computer system having a processor and memory, the method comprising the steps of:

providing a first layout of the circuit design;

the computer system identifying in the first layout a subject transistor having shapes for defining on the integrated circuit source and drain diffusion regions and a gate conductor overlying a channel region, for which the source diffusion region is no wider than the drain diffusion region where they respectively meet the channel region, the first layout including a first shape for defining at least the source diffusion region of the subject transistor, and a second shape for defining at least the gate conductor of the subject transistor, the first shape having transversely opposite first and second longitudinal sides along the length of the diffusion regions, the corner of the first shape which is on the first longitudinal side thereof, and which is on the same side of the gate conductor longitudinally as is the source diffusion region, and which is located nearest to the gate conductor longitudinally, being sufficiently spaced from the gate conductor longitudinally such that any corner rounding introduced during lithographic printing of the first shape onto the integrated circuit will not extend into the channel region;

the computer system revising the first layout by adding a first transversely extending protrusion to the first shape on the first longitudinal side thereof, the first protrusion having at least a portion which is on the same side of the gate conductor longitudinally as is the source diffusion region, the first protrusion having an inner corner located relative to the gate conductor longitudinally such that during lithographic printing of the first protrusion onto the integrated circuit, the inner corner will round and extend at least partly within the channel region, the gate conductor being closer in the revised layout to the inner corner of the first protrusion than to any corner of the drain diffusion region, and providing for making a set of lithographic reticles, a layout in dependence upon the revised layout.

2. A method according to claim 1, further comprising the step of revising the layout also to add a second transversely extending protrusion on the first longitudinal side of the first shape on the same side of the second shape longitudinally as the drain diffusion region, the second protrusion having an inner corner proximal to the second shape, the second protrusion being located sufficiently near the second shape longitudinally such that during lithographic printing of the first shape onto the integrated circuit, the inner corner of the second protrusion will round so as to at least partially underlie the gate conductor.

3. A method according to claim 1, wherein as provided for making the reticle, the first shape includes no transversely extending second protrusion on the same side of the second shape longitudinally as the drain diffusion region, which second protrusion is located so near to the second shape longitudinally that during lithographic printing, the inner corner of the second protrusion will round and at least partially underlie the gate conductor.

4. A method according to claim 1, wherein the first shape further includes a second transversely extending protrusion on the second longitudinal side of the first shape, the second protrusion having an inner corner and an outer corner, the second protrusion being located relative to the second shape longitudinally such that during lithographic printing of the first shape onto the integrated circuit, at least one of the inner and outer corners of the second protrusion will round and extend at least partly within the channel region.

5. A method according to claim 4, wherein the second protrusion is located on the same side of the second shape longitudinally as the source diffusion region, and is located relative to the second shape longitudinally such that during lithographic printing of the first shape onto the integrated circuit, the inner corner of the second protrusion will round and extend at least partly into the channel region.

6. A method according to claim 4, wherein the second protrusion is located on the same side of the second shape longitudinally as the drain diffusion region, and is located relative to the second shape longitudinally such that during lithographic printing of the first shape onto the integrated circuit, the outer corner of the second protrusion will round and extend at least partly into the channel region.

7. A method according to claim 1, wherein the first protrusion is located at a longitudinal position which overlaps with the second shape longitudinally, the first protrusion further having an outer corner located such that during lithographic printing of the first shape onto the integrated circuit, both the inner and outer corners of the first protrusion will round and be disposed at least partly within the channel region.

8. A method according to claim 7, further comprising the step of revising the layout also to add a second transversely extending protrusion on the first longitudinal side of the first shape, the second protrusion having an inner corner and an outer corner, the second protrusion being located relative to the first protrusion such that the inner corner of the second protrusion is transversely proximal to the outer corner of the first protrusion, the second protrusion being located relative to the second shape longitudinally such that during lithographic printing of the first shape onto the integrated circuit, the inner corner of the second protrusion will round and extend at least partly within the channel region.

9. A product made using the process of claim 1.

10. The product of claim 9, wherein the product comprises a set of lithographic reticles.

11. The product of claim 9, wherein the product comprises an integrated circuit device.

12. A method for laying out a circuit design, the circuit design specifying a transistor having source, drain and gate nodes, the method being for use on a computer system having a processor and a memory, comprising the steps of:

the computer system laying out the circuit in a manner which defines first and second diffusion regions on longitudinally opposite sides of a gate conductor, the first diffusion region including a first transversely extending protrusion and having a width larger than the second diffusion region;

the computer system determining, based on the laid out geometries, which of the diffusion regions has the larger width; and the computer system, in dependence upon the determination made in the step of determining, laying out circuit interconnects in a manner which connects the diffusion region with the larger width as the source of the transistor, the gate conductor being closer in the layout to the inner corner of the first protrusion than to any corner of the drain diffusion region.

13. A product made using the process of claim 12.

14. A product comprising a non-transitory computer readable medium carrying a layout database made using the process of claim 12.

15. The product of claim 13, wherein the product comprises a set of lithographic reticles.

16. The product of claim 13, wherein the product comprises an integrated circuit device.

17. A method for revising a layout of a circuit design, for use in forming a lithographic reticle set for use in fabricating an integrated circuit, the method being for use by a computer system having a processor and memory, the method comprising the steps of:

the computer system identifying in a layout a subject transistor having shapes for defining on the integrated circuit source and drain diffusion regions and a gate conductor overlying a channel region, for which the source diffusion region is no wider than the drain diffusion region where they respectively meet the channel region, the layout including a first shape for defining at least the drain diffusion region of the subject transistor, and a second shape for defining at least the gate conductor of the transistor;

the computer system adding a first transversely intruding cut-out to the first shape, the first cut-out having at least a portion which is on the same side of the gate conductor longitudinally as is the drain diffusion region, the first cut-out having an outer corner located relative to the gate conductor longitudinally such that during lithographic printing of the first cut-out onto the integrated circuit, the corner will round and extend at least partly within the channel region; and the computer system revising the layout also to add a second transversely intruding cut-out on the first longitudinal side of the first shape on the same side of the second shape longitudinally as the source diffusion region, the second cut-out having an outer corner proximal to the second shape, the second cut-out being located sufficiently near the second shape longitudinally such that during lithographic printing of the first shape onto the integrated circuit, the outer corner of the second cut-out will round so as to at least partially underlie the gate conductor.

18. A product made using the process of claim 17.

19. The product of claim 18, wherein the product comprises a set of lithographic reticles.

20. The product of claim 18, wherein the product comprises an integrated circuit device.

21. A method for revising a layout of a circuit design, for use in forming a lithographic reticle set for use in fabricating an integrated circuit, the method being for use by a computer system having a processor and memory, the method comprising the steps of:

the computer system identifying in a layout a subject transistor having shapes for defining on the integrated circuit source and drain diffusion regions and a gate conductor overlying a channel region, for which the source diffusion region is no wider than the drain diffusion region where they respectively meet the channel region, the layout including a first shape for defining at least the drain diffusion region of the subject transistor, and a second shape for defining at least the gate conductor of the transistor; and the computer system adding a first transversely intruding cut-out to the first shape, the first cut-out having at least a portion which is on the same side of the gate conductor longitudinally as is the drain diffusion region, the first cut-out having an outer corner located relative to the gate conductor longitudinally such that during lithographic printing of the first cut-out onto the integrated circuit, the corner will round and extend at least partly within the channel region, wherein the first shape further includes a second transversely intruding cut-out on the second longitudinal side of the first shape, the second cut-out having an inner corner and an outer corner, the second cut-out being located relative to the second shape longitudinally such that during lithographic printing of the first shape onto the integrated circuit, at least one of the inner and outer corners of the second cut-out will round and extend at least partly within the channel region.

22. A method according to claim 21, wherein the second cut-out is located on the same side of the second shape longitudinally as the drain diffusion region, and is located relative to the second shape longitudinally such that during lithographic printing of the first shape onto the integrated circuit, the outer corner of the second cut-out will round and extend at least partly into the channel region.

23. A method according to claim 21, wherein the first cut-out is located on the same side of the second shape longitudinally as the drain diffusion region, and is located relative to the second shape longitudinally such that during lithographic printing of the first shape onto the integrated circuit, the inner corner of the first cut-out will round and extend at least partly into the channel region.

24. A product made using the process of claim 21.

25. The product of claim 24, wherein the product comprises a set of lithographic reticles.

26. The product of claim 24, wherein the product comprises an integrated circuit device.

27. A method for revising a layout of a circuit design, for use in forming a lithographic reticle set for use in fabricating an integrated circuit, the method being for use by a computer system having a processor and memory, the method comprising the steps of:

the computer system identifying in a layout a subject transistor having shapes for defining on the integrated circuit source and drain diffusion regions and a gate conductor overlying a channel region, for which the source diffusion region is no wider than the drain diffusion region where they respectively meet the channel region, the layout including a first shape for defining at least the drain diffusion region of the subject transistor, and a second shape for defining at least the gate conductor of the transistor; and the computer system adding a first transversely intruding cut-out to the first shape, the first cut-out having at least a portion which is on the same side of the gate conductor longitudinally as is the drain diffusion region, the first cut-out having an outer corner located relative to the gate conductor longitudinally such that during lithographic printing of the first cut-out onto the integrated circuit, the corner will round and extend at least partly within the channel region, wherein the first cut-out is located at a longitudinal position which overlaps with the second shape longitudinally, the first cut-out further having an inner corner located such that during lithographic printing of the first shape onto the integrated circuit, both the inner and outer corners of the first cut-out will round and be disposed at least partly within the channel region.

28. A method according to claim 27, further comprising the step of revising the layout also to add a second transversely intruding cut-out on the first longitudinal side of the first shape, the second cut-out having an inner corner and an outer corner, the second cut-out being located relative to the first cut-out such that the outer corner of the second cut-out is transversely proximal to the inner corner of the first cut-out, the second cut-out being located relative to the second shape longitudinally such that during lithographic printing of the first shape onto the integrated circuit, the outer corner of the second cut-out will round and extend at least partly within the channel region.

29. A product made using the process of claim 27.

30. The product of claim 29, wherein the product comprises a set of lithographic reticles.

31. The product of claim 29, wherein the product comprises an integrated circuit device.

32. A method for revising a layout of a circuit design, for use in forming a set of lithographic reticles for use in fabricating an integrated circuit, the method being for use by a computer system having a processor and memory, the method comprising the steps of:
  providing a first layout of the circuit design;
  the computer system identifying in the first layout shapes for defining first and second channel regions for respective first and second transistors, first and second gate conductors overlying respectively the first and second channel regions, first and second diffusion sub-regions on longitudinally opposite sides of the first channel region, and a third diffusion sub-region on the side of the second channel region longitudinally opposite the second diffusion sub-region, the first and second diffusion regions being connected in a circuit as respectively first and second current path terminals of the first transistor, and the second and third diffusion regions being connected in a circuit as respectively first and second current path terminals of the second transistor,
    the shapes including a first shape for defining a geometric union of the first and second channel regions and the first, second and third diffusion sub-regions, a second shape for defining the first gate conductor and a third shape for defining the second gate conductor, the second and third shapes each crossing the first shape transversely,
    wherein the first shape has transversely opposite first and second sides along the length of the second diffusion region; and
  the computer system revising the first layout by adding a transversely extending protrusion on the first side of the first shape, the protrusion having a first inner corner proximal to the second shape and a second inner corner proximal to the third shape,
  the first inner corner of the protrusion being located in the revised layout relative to the second shape longitudinally such that during lithographic printing of the first shape onto the integrated circuit, the first inner corner will round and extend at least partly within the first channel region,
  and the second inner corner of the protrusion being located in the revised layout relative to the third shape longitudinally such that during lithographic printing of the first shape onto the integrated circuit, the second inner corner will round and extend at least partly within the second channel region.

33. A method according to claim 32, further comprising the step of the computer system adding
  a second transversely extending protrusion on the first side of the first shape and within the first diffusion sub-region, the second protrusion having an inner corner proximal to the second shape,
  and a third transversely extending protrusion on the first side of the first shape and within the third diffusion sub-region, the third protrusion having an inner corner proximal to the third shape,
  the inner corner of the second protrusion being located sufficiently near the second shape longitudinally such that during lithographic printing of the first shape onto the integrated circuit, the inner corner of the second protrusion will round so as to extend at least partly into the first channel region,
  and the inner corner of the third protrusion being located sufficiently near the third shape longitudinally such that during lithographic printing of the first shape onto the integrated circuit, the inner corner of the third protrusion will round so as to extend at least partly into the second channel region.

34. A method according to claim 32, wherein as provided for making the reticle, the first shape includes no transversely extending second protrusion within the first and third diffusion sub-regions, which second protrusion is located so near to one of the second and third shapes longitudinally that during lithographic printing, an inner corner of the second protrusion will round so as to extend at least partly into one of the channel regions.

35. A method according to claim 34, wherein the layout further includes shapes for connecting the second diffusion sub-region as a shared source of both the first and second transistors.

36. A method according to claim 32, further comprising the step of the computer system adding a second transversely extending protrusion on the second side of the first shape, the second protrusion having a third inner corner proximal to the second shape and a fourth inner corner proximal to the third shape,
  the third inner corner being located relative to the second shape longitudinally such that during lithographic printing of the first shape onto the integrated circuit, the third inner corner will round and extend at least partly into the first channel region,
  and the fourth inner corner being located relative to the third shape longitudinally such that during lithographic printing of the first shape onto the integrated circuit, the fourth inner corner will round and extend at least partly into the second channel region.

37. A product made using the process of claim 32.

38. The product of claim 37, wherein the product comprises a set of lithographic reticles.

39. The product of claim 37, wherein the product comprises an integrated circuit device.

40. A product comprising a non-transitory computer readable medium carrying a layout database made using the process of claim 32.

* * * * *